United States Patent
Gorobets et al.

(10) Patent No.: US 9,176,864 B2
(45) Date of Patent: Nov. 3, 2015

(54) NON-VOLATILE MEMORY AND METHOD HAVING BLOCK MANAGEMENT WITH HOT/COLD DATA SORTING

(75) Inventors: Sergey Anatolievich Gorobets, Edinburgh (GB); Alan David Bennett, Edinburgh (GB); Tom Hugh Shippey, Edinburgh (GB); Liam Michael Parker, Edinburgh (GB); Yauheni Yaromenka, Gomel (BY); Steven T. Sprouse, San Jose, CA (US); William S. Wu, Cupertino, CA (US); Marielle Bundukin, Hayward, CA (US)

(73) Assignee: SANDISK TECHNOLOGIES, INC., Plano, TX (US)

( * ) Notice: Subject to any disclaimer, the term of this patent is extended or adjusted under 35 U.S.C. 154(b) by 125 days.

(21) Appl. No.: 13/468,737

(22) Filed: May 10, 2012

(65) Prior Publication Data

US 2012/0297122 A1 Nov. 22, 2012

Related U.S. Application Data

(60) Provisional application No. 61/487,244, filed on May 17, 2011.

(51) Int. Cl.
  *G06F 12/00* (2006.01)
  *G06F 12/02* (2006.01)
  *G06F 3/06* (2006.01)

(52) U.S. Cl.
  CPC ............ *G06F 12/0246* (2013.01); *G06F 3/064* (2013.01); *G06F 3/068* (2013.01);
  (Continued)

(58) Field of Classification Search
  CPC ... G06F 12/0246; G06F 3/0679; G11C 16/10; G11C 16/26; G11C 16/0483; G11C 16/102

USPC .......................................................... 711/103
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |

(Continued)

FOREIGN PATENT DOCUMENTS

| | | |
|---|---|---|
| WO | WO 2007/029259 | 3/2007 |
| WO | WO 2010/077920 | 7/2010 |
| WO | WO 2012/021847 | 2/2012 |

OTHER PUBLICATIONS

Notification of Transmittal of the International Search Report and the Written Opinion of the International Searching Authority, or the Declaration, International Appl. No. PCT/US2012/037528 mailed Oct. 24, 2012, 12 pages.

(Continued)

*Primary Examiner* — Charles Rones
*Assistant Examiner* — Nanci Wong
(74) *Attorney, Agent, or Firm* — Davis Wright Tremaine LLP

(57) ABSTRACT

A non-volatile memory organized into flash erasable blocks sorts units of data according to a temperature assigned to each unit of data, where a higher temperature indicates a higher probability that the unit of data will suffer subsequent rewrites due to garbage collection operations. The units of data either come from a host write or from a relocation operation. The data are sorted either for storing into different storage portions, such as SLC and MLC, or into different operating streams, depending on their temperatures. This allows data of similar temperature to be dealt with in a manner appropriate for its temperature in order to minimize rewrites. Examples of a unit of data include a logical group and a block.

32 Claims, 20 Drawing Sheets

(52) U.S. Cl.
CPC .......... *G06F 3/0611* (2013.01); *G06F 3/0679* (2013.01); *G06F 2212/7202* (2013.01); *G06F 2212/7211* (2013.01); *G11C 2211/5641* (2013.01)

(56) References Cited

U.S. PATENT DOCUMENTS

| | | | |
|---|---|---|---|
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,671,388 | A | 9/1997 | Hasbun |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,139,864 | B2 | 11/2006 | Bennett et al. |
| 7,509,471 | B2 | 3/2009 | Gorobets |
| 7,633,799 | B2 | 12/2009 | Gorobets et al. |
| 7,874,067 | B1 | 1/2011 | Hiew et al. |
| 8,046,752 | B2 | 10/2011 | Chilimbi et al. |
| 8,566,483 | B1 * | 10/2013 | Chen et al. ............ 710/18 |
| 2002/0073285 | A1 | 6/2002 | Butterworth |
| 2005/0144516 | A1 | 6/2005 | Gonzalez et al. |
| 2007/0101095 | A1 | 5/2007 | Gorobets |
| 2007/0150694 | A1 * | 6/2007 | Chang et al. .......... 711/202 |
| 2008/0112238 | A1 | 5/2008 | Kim et al. |
| 2008/0126680 | A1 | 5/2008 | Lee et al. |
| 2008/0209112 | A1 | 8/2008 | Yu et al. |
| 2008/0235432 | A1 | 9/2008 | Chen et al. |
| 2008/0235467 | A1 | 9/2008 | Tagawa |
| 2008/0244164 | A1 | 10/2008 | Chang et al. |
| 2009/0019218 | A1 * | 1/2009 | Sinclair et al. ........ 711/103 |
| 2009/0138654 | A1 | 5/2009 | Sutardja |
| 2009/0300269 | A1 * | 12/2009 | Radke et al. .......... 711/103 |
| 2009/0307427 | A1 | 12/2009 | Takasuka et al. |
| 2010/0036998 | A1 * | 2/2010 | Ben-Rubi .............. 711/100 |
| 2010/0049908 | A1 * | 2/2010 | Gonzalez et al. ...... 711/103 |
| 2010/0064096 | A1 * | 3/2010 | Weingarten et al. ... 711/103 |
| 2010/0122019 | A1 | 5/2010 | Flynn et al. |
| 2010/0169540 | A1 | 7/2010 | Sinclair |
| 2010/0172180 | A1 | 7/2010 | Paley et al. |
| 2010/0174845 | A1 | 7/2010 | Gorobets et al. |
| 2010/0174847 | A1 | 7/2010 | Paley et al. |
| 2010/0205352 | A1 | 8/2010 | Chu et al. |
| 2010/0318839 | A1 | 12/2010 | Avila et al. |
| 2011/0010489 | A1 | 1/2011 | Yeh |
| 2011/0029715 | A1 | 2/2011 | Hu et al. |
| 2011/0066808 | A1 | 3/2011 | Flynn et al. |
| 2011/0153912 | A1 | 6/2011 | Gorobets et al. |
| 2011/0161561 | A1 | 6/2011 | Tsai et al. |
| 2011/0173395 | A1 * | 7/2011 | Bhattacharjee et al. ...... 711/135 |
| 2011/0264843 | A1 * | 10/2011 | Haines et al. ............ 711/103 |
| 2011/0296122 | A1 | 12/2011 | Wu et al. |
| 2012/0023144 | A1 * | 1/2012 | Rub ........................ 707/813 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Office Action, U.S. Appl. No. 13/468,720, mailed on Jan. 6, 2014, 20 pages.

Office Action, U.S. Appl. No. 13/556,035, mailed on Mar. 26, 2014, 17 pages.

Office Action, U.S. Appl. No. 13/468,720, mailed on Jun. 3, 2014, 18 pages.

Non-Final Office Action issued for U.S. Appl. No. 13/556,035 dated Mar. 10, 2015, 17 pages.

* cited by examiner

Programming into two states represented by a 1-bit code

| Block types | | Active Binary Working Set blocks | | | | | | | MLC (X2) Blocks |
|---|---|---|---|---|---|---|---|---|---|
| LG Mapping | | Master Index Page (MIP) | | | | | | | GAT |
| | LGs | Hot LGs | | | | Cold LGs | | | |
| | LG Temperature | Maximum | . | . | Lowest Hot | Highest Cold | . | . | Minimum | Minimum |
| | value | 7 | 6 | 5 | 4 | 3 | 2 | 1 | 0 | 0 |
| initial state - MLC | | | | | | | | | | |
| LG hit #1 | | 7 | | 5 | 4 | 3 | | | 0 | 0 |
| LG hit #2 | | 7 | 6 | 5 | | | | | | |
| LG hit #3 | | 7 | 6 | | | | | | | |
| LG hit #4 | | | 6 | | | | | | | |
| LG hit #5 | | | 6 | 5 | | | | | | |
| no LG hit | | | 6 | 5 | | | | | | |
| no LG hit | | | 6 | 5 | | | | | | |
| fold triggered decrease | | | | 5 | | | | | | |
| no LG hit | | | | 5 | | | | | | |
| no LG hit | | | | 5 | | | | | | |
| fold triggered decrease | | | | | | | | | | |
| no LG hit | | | | | | | | | | | fast warming
slow cooling
initial value

FIG. 16

| | Block types | Active Binary Working Set blocks | | | | | | MLC (X2) Blocks |
|---|---|---|---|---|---|---|---|---|
| | LG Mapping | Master Index Page (MIP) | | | | | | GAT |
| | LGs | Hot LGs | | | | Cold LGs | | |
| | LG Temperature | Maximum | . | . | Lowest Hot | Highest Cold | . | . | Minimum | Minimum |
| | value | 7 | 6 | 5 | 4 | 3 | 2 | 1 | 0 | 0 |
| initial state - MLC | | | | | | | | | | |
| no LG hit | | | | | | 3 | 2 | 1 | 0 | 0 |
| no LG hit | | | | | | 3 | 2 | | | |
| no LG hit | | | | | | 3 | 2 | | | |
| fold triggered decrease | | | | | | | | | | |
| no LG hit | | | | | | | 2 | 1 | | |
| no LG hit | | | | | | | 2 | 1 | | |
| no LG hit | | | | | | | | 1 | | |
| fold triggered decrease | | | | | | | | | | |
| no LG hit | | | | | | | | | 0 | folding |
| no LG hit | | | | | | | | | 0 | |
| fold to MLC | | | | | | | | | | 0 |

FIG. 17

NON-VOLATILE MEMORY AND METHOD HAVING BLOCK MANAGEMENT WITH HOT/COLD DATA SORTING

CROSS-REFERENCED APPLICATIONS

This application claims priority to U.S. Provisional Application No. 61/487,244 filed May 17, 2011, which application is incorporated in its entirety by this reference.

This application is related to a U.S. patent application Ser. No. 13/468,720 filed May 10, 2012, that claims priority to U.S. Provisional Application No, 61/487,234 filed May 17, 2011, entitled "NON-VOLATILE MEMORY AND METHOD WITH SMALL LOGICAL GROUPS DISTRIBUTED AMONG ACTIVE SLC AND MLC MEMORY PARTITIONS," and which entire disclosure is incorporated herein by reference.

FIELD OF THE INVENTION

This application relates to the operation of re-programmable non-volatile memory systems such as semiconductor flash memory, and, more specifically, to efficient storing of data in block structures while minimizing rewrites.

BACKGROUND OF THE INVENTION

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. More recently, flash memory in the form of solid-state disks ("SSD") is beginning to replace hard disks in portable computers as well as in fixed location installations. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card or SSD are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Current commercial products configure each storage element of a flash EEPROM array to store either a single bit of data or more than a single bit of data. A single-level-cell (SLC) memory has each cell storing a single bit of data by operating in a binary mode, where a single reference level differentiates between two ranges of threshold levels of each storage element.

The threshold levels of transistors correspond to ranges of charge levels stored on their storage elements. In addition to shrinking the size of the memory arrays, the trend is to further increase the density of data storage of such memory arrays by storing more than one bit of data in each storage element transistor. A multi-level-cell (MLC) memory has each cell storing more a single bit of data by operating in a multi-level mode, where two or more reference levels differentiates between more than two ranges of threshold levels of each storage element. For example, commercial flash memory products now operate in four states (2 bits of data per storage element) or eight states (3 bits of data per storage element) or 16 states per storage element (4 bits of data per storage element). Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. More recently, the memory devices in the form of SSD are being offered commercially in the form factor of a standard hard drive.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Flash Memory Characteristics and Trends

Flash memory behaves quite differently from traditional disk storage or RAM. First, existing data stored in the flash memory cannot be updated by simply being overwritten. Each cell must first be erased before a new write can take place on it. Consequently the update is always written to a new free location. To improve performance, a group of cells are operated on in parallel to access data page by page. When a page of data is updated by having the updated page written to a new location, the superseded page is rendered invalid and obsolete and becomes garbage cluttering the storage and will eventually be cleaned out to free up the space it is occupying.

Managing the updates and discarding the invalid ones are complicated by the block structure of flash memory. it is relatively time consuming to erase flash memory and to improve erase performance, the memory is organized into erase blocks where a whole block of memory cells are erased together simultaneously. A block generally contains a number of pages. As data is stored in a block page by page, eventually some of that data becomes obsolete. This means the block will contain many garbage data taking up space. However, the block can only be erased as a unit and so before the garbage data can be erased with the block, the valid data in the block must first be salvaged and copied into another block. This operation is commonly referred to as garbage collection and is an overhead of the block structure of the flash memory. The larger the block, the more time is required for the garbage collection. Similarly, the more frequently the data in the block is being updated, the more frequently will the block need to be garbage collect. Garbage collection is preferably performed in the foreground like during a write operation. This obviously will degrade the write speed.

Early applications of flash memory have been mainly for storing media files such as music and video files for portable hosts. These files tend to be a long run of data of sequential logical addresses which fills up the memory block by block. These data are archival in nature and not subject to much updating. Thus, the block structure works well for these type of data and there is little performance hit during writing since there is seldom need for garbage collection. The orderly sequential-address nature of the data allows logical address range to be partitioned into logical groups, with each logical group aligned with an erase block in the sense that the data of a logical group will fit neatly in a block. In this way, the addressing granularity is mainly at the block level as a page with a given logical address can be located by which block is storing the logical group it belongs to. Since the logical group is stored in the block in a self-indexed manner with its logical addresses in sequential order, the page can be quickly located.

The block management system implementing logical groups typically deals with updates and non-sequential writes by tracking them at the page level. It budgets a predetermined amount of resource for the page level tracking which manifests has limiting the number of logical groups having non-sequential or obsolete data. Generally, when subject to updates, some of the orderly blocks will contain obsolete data and keeping track of them will also consume part of the resource. When over the budget, a selected block with non-sequential or obsolete data is restored back to an orderly block in sequential order. This is accomplished by rewriting into a new block in sequential order with the latest updates. However the relocation will exact performance hit. Such a system will work well if a host writes data that are conducive to maintaining mostly such orderly blocks being tracked at the block level, with only some random writes being tracked at the page level. Thus, by implementing logical groups aligned to block boundary, the address table is greatly simplified and reduced.

However, the block management system implementing logical groups will begin to be less optimized if the host writes mostly short and non-sequential data. This type of write pattern is prevalent in applications from a personal computer or smart mobile device. Solid-state disk (SSD) using flash memory is an attractive replacement for disk storage due to its low power, speed and ruggedness. Instead of long sequential writes, the flash memory must now deal mostly with short random writes. Initially, the performance will not suffer since as long as free space can be found, the data can be written there. However, with constant use and frequent updates, the predetermined resource for page tracking will eventually be exhausted. At that point, performance can take a big hit as the next write may have to be accompanied by a relocation of a block. The larger is the block the longer it will take to perform relocation of a block. Also a large block and short and non-sequential data will cause the logical group in the block to contain invalid data more frequently and consume page addressing resource faster and therefore cause relocation to take place more frequently.

The problem with the large block size cannot be easily solved by simply reducing the block size as the block size tend to increase geometrically with each new generation of memory technology. With higher integration of circuits more memory cells are being fitted in the same die. The block size, measure in columns and rows increases geometrically. This is especially the case for memory of the NAND type. The memory is an array of NAND strings where each string is a daisy chain of memory cells and a minimum erase block must be formed by a row of such NAND string. If the NAND string has 32 cells, a block will contain 32 rows of cells. The number of memory cells in a NAND string also increases with each generation, so the block size increases column-wise and row-wise.

The block size, which is dictated by the physical memory structure, is in present generation as large as 4 MB. On the other hand, the operating system of personal computers typically allocates logical sectors in size of 512 kB and often writes a page as a cluster of logical sectors in 4 kB unit. Thus, there is a great mismatch in the addressing granularity of a logical group corresponding to a block and a page. In the scheme of logical group, the ideal situation for a block is either nothing is written or the block is filled up sequentially with the entire logical group of valid data. In either case there is no fragmentation and there is no need for garbage collection or relocation. In the case of short random writes into a large block, the block becomes non-ideal very quickly and eventually will need relocation. This amounts to inefficient writes since the same page may have to be written and then re-copied one or more times (also referred to as "write amplification".)

An alternative, conventional addressing approach suitable for short random writes is to not use logical groups, but to track every page independently as it is being written to a block. Instead of maintaining the stored data as orderly logical group in a block, each page is tracked as to which block it is stored in and at what offset in the block. Thus, in this page addressing scheme, there is no burden of storing or maintaining data in groups in order of sequential logical addresses. However, the page addressing scheme will have an address table much larger than that for the logical group address scheme. For example, if there are 1000 pages in a block, then the address table for the page addressing scheme will be approximately 2 to 3 orders of magnitude larger.

The page addressing scheme exact penalty in terms of a much larger address table. In practice, it will require more system resources and a relative large RAM to work with the memory controller. This is because the address table is usually maintained in flash memory but is cached to the controller RAM during operation to provide faster access. Current technology allows at most 2 to 4 MB of RAM to be fabricated on the controller chip. This is insufficient for systems using a page addressing scheme and additional external RAM chips will be required. The additional pinouts and interface circuits to support external RAM chips would add significantly to the cost.

Another problem with addressing granularity having very small units, such as 4 kB, is that it creates fragmented data, which is scattered between the blocks so much that maximum parallelism during read and data copy (due to update) is not achievable. Also, the amount of copy increases as small update can still trigger copy of one or more entire block.

Thus, there is a need to provide a nonvolatile memory that can efficiently handle data access characterized by short random writes into large blocks without suffering from the disadvantages and problems mentioned above.

SUMMARY OF THE INVENTION

Hot/Cold Logical Group Sorting

A non-volatile memory organized into flash erasable blocks sorts units of data according to a temperature assigned to each unit of data, where a higher temperature indicates a higher probability that the unit of data will suffer subsequent rewrites due to garbage collection operations. The units of data either come from a host write or from a relocation operation. The data are sorted either for storing into different storage portions, such as SLC and MLC, or into different operating streams, depending on their temperatures. This allows data of similar temperature to be dealt with in a manner appropriate for its temperature in order to minimize rewrites. Examples of a unit of data include a logical group and a block.

In one embodiment, a non-volatile memory organized into flash erasable blocks receives data from host writes by first staging into logical groups before writing into the blocks. Each logical group contains data from a predefined set of order logical addresses and has a fixed size smaller than a block. The memory is also partitioned into SLC and MLC portions. Each logical group is assigned a temperature as a measure of a probability the logical group will be rewritten owning to parts of it becoming obsolete and requiring garbage collection operations. When more room is needed in the SLC portion, logical groups with the coldest temperature are preferentially relocated from the SLC portion to the MLC portion. In another aspect, a similar temperature is assigned at the block level rather than at the logical group level.

In a preferred implementation, the memory is partitioned in SLC and MLC portions and comprises, first, second and third operational and functional layers. The first and second layers operate in the SLC portion. The third layer operates in the MLC portion. The first layer is for initially storing write data from a host and staging the data logical-group by logical-group before relocating each logical group into either the second or third layer. The second layer provides active storage in a pool of SLC blocks for storing host data at the logical-group level. When the pool is full, more room is made by evicting the logical groups with the least potential rewrites to the third layer which stores at a higher density.

Each logical group in the second layer is ranked by its potential for future rewrites due to garbage collection. A temperature from a finite range is assigned to each logical group with the coldest logical group first to be evicted to the third layer. Ranking criteria include the rate of update the logical group is experiencing and the length of time the logical group is between updates. Logical groups relocated from the second memory layer to the third memory layer will be accessed at the third memory layer. Logical group remaining at the second memory layer will be accessed directly at the second memory layer.

In another embodiment, the unit of data is a block and a temperature is assigned at the block level. In a relocation operation, the coldest temperature blocks are preferentially relocated first.

In another embodiment, units of data are sorted according to their temperatures into different block streams such that the blocks in each operating stream only involves data of similar temperature. The goal is to separate hot data from cold data as soon as possible and at every opportunity. The hot data and cold data have different obsolescence and garbage collection/ relocation schedules. For example, hot data will become obsolete faster and require more frequent garbage collection/ rewrites. When the cold data are not mixed in with the hot data, it will not incur unnecessary rewrites. Most likely, the hot data will obsolete itself without triggering relocation of cold data from one block to another block, and the cold data in cold blocks will stay there without compactions/relocations due to the hot data.

Additional features and advantages of the present invention will be understood from the following description of its preferred embodiments, which description should be taken in conjunction with the accompanying drawings.

BRIEF DESCRIPTION OF THE DRAWINGS

FIG. 16 illustrates the 'temperature' sorting of the logical groups for the 'hot' logical group case.

FIG. 17 illustrates the 'temperature' sorting of the logical groups for the 'cold' logical group case.

DETAILED DESCRIPTION OF THE PREFERRED EMBODIMENTS

Memory System

Figure 1:
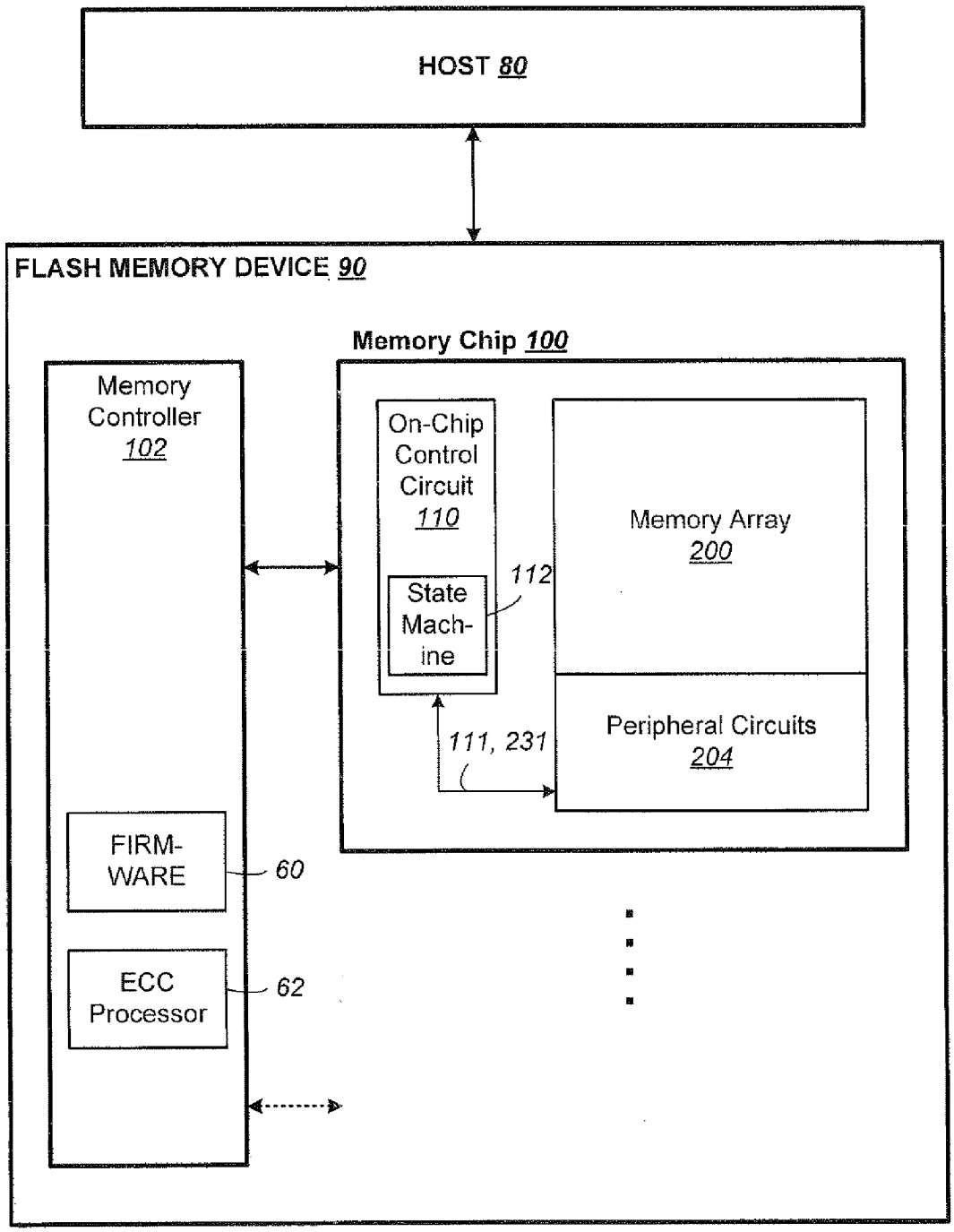
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a memory controller 102. The memory chip 100 includes a memory array 200 of memory cells with each cell capable of being configured as a multi-level cell ("MLC") for storing multiple bits of data, as well as capable of being configured as a single-level cell ("SLC") for storing 1 bit of data. The memory chip also includes peripheral circuits 204 such as row and column decoders, sense modules, data latches and I/O circuits. An on-chip control circuitry 110 controls low-level memory operations of each chip. The control circuitry 110 is an on-chip controller that cooperates with the peripheral circuits to perform memory operations on the memory array 200. The control circuitry 110 typically includes a state machine 112 to provide chip level control of memory operations via a data bus 231 and control and address bus 111.

In many implementations, the host 80 communicates and interacts with the memory chip 100 via the memory controller 102. The controller 102 co-operates with the memory chip and controls and manages higher level memory operations. A firmware 60 provides codes to implement the functions of the controller 102. An error correction code ("ECC") processor 62 processes ECC during operations of the memory device.

For example, in a host write, the host 10 sends data to be written to the memory array 100 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Figure 2:
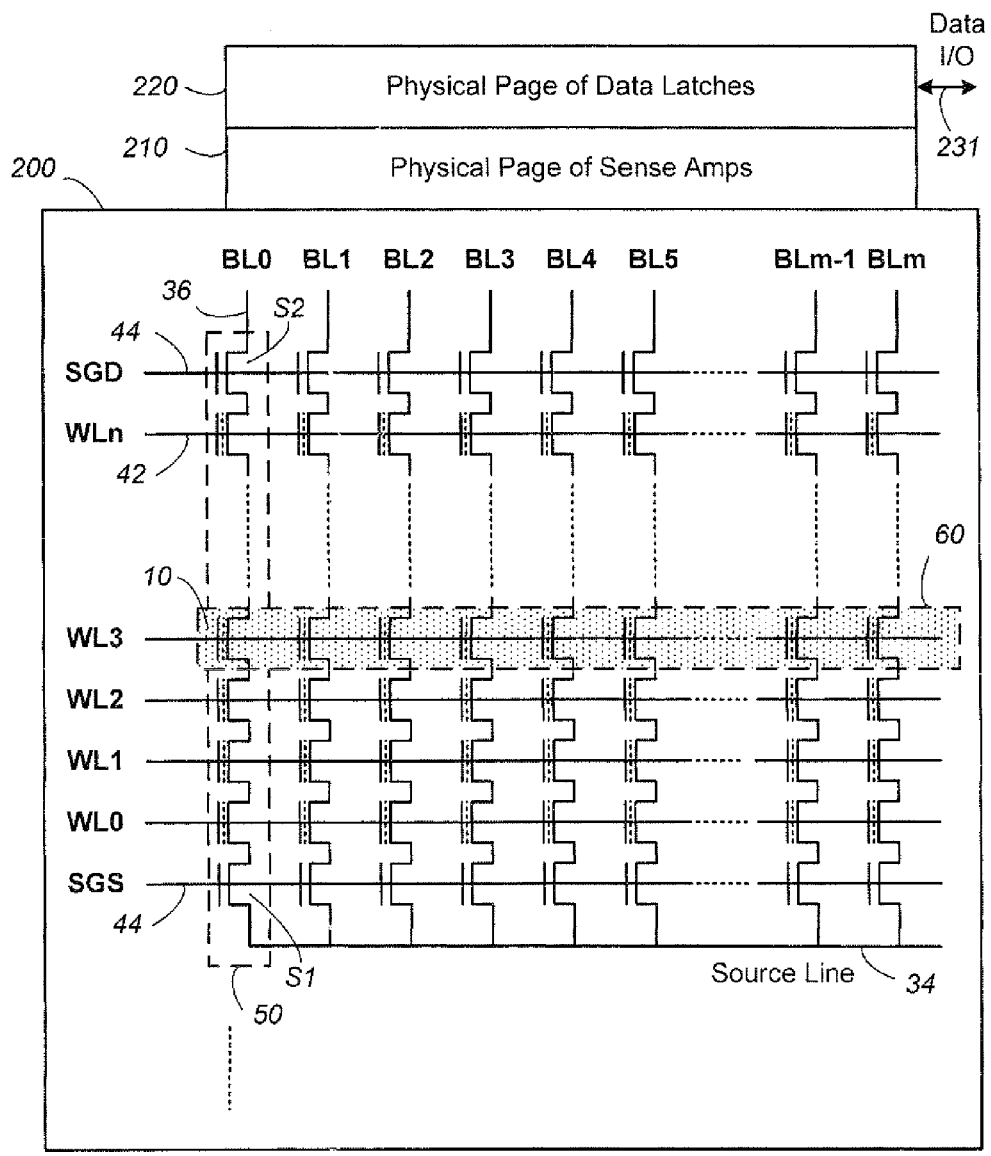
FIG. 2 illustrates a page of memory cells, organized for example in the NAND configuration, being sensed or programmed in parallel.

FIG. 2 illustrates a page of memory cells, organized for example in the NAND configuration, being sensed or programmed in parallel. FIG. 2 essentially shows a bank of NAND strings 50 in the memory array 200 of FIG. 1. A "page" such as the page 60, is a group of memory cells enabled to be sensed or programmed in parallel. This is accomplished in the peripheral circuits by a corresponding page of sense amplifiers 210. The sensed results are latches in a corresponding set of data latches 220. Each sense amplifier can be coupled to a NAND string, such as NAND string 50 via a bit line 36. For example, the page 60 is along a row and is sensed by a sensing voltage applied to the control gates of the cells of the page connected in common to the word line WL3. Along each column, each cell such as cell 10 is accessible by a sense amplifier via a bit line 36. Data in the data latches 220 are toggled in from or out to the memory controller 102 via a data I/O bus 231.

The page referred to above is a physical page memory cells or sense amplifiers. Depending on context, in the case where each cell is storing multi-bit data, each physical page has multiple data pages.

The NAND string 50 is a series of memory transistors 10 daisy-chained by their sources and drains to form a source terminal and a drain terminal respective at its two ends. A pair of select transistors S1, S2 controls the memory transistors chain's connection to the external via the NAND string's source terminal and drain terminal respectively. In a memory array, when the source select transistor Si is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 3:
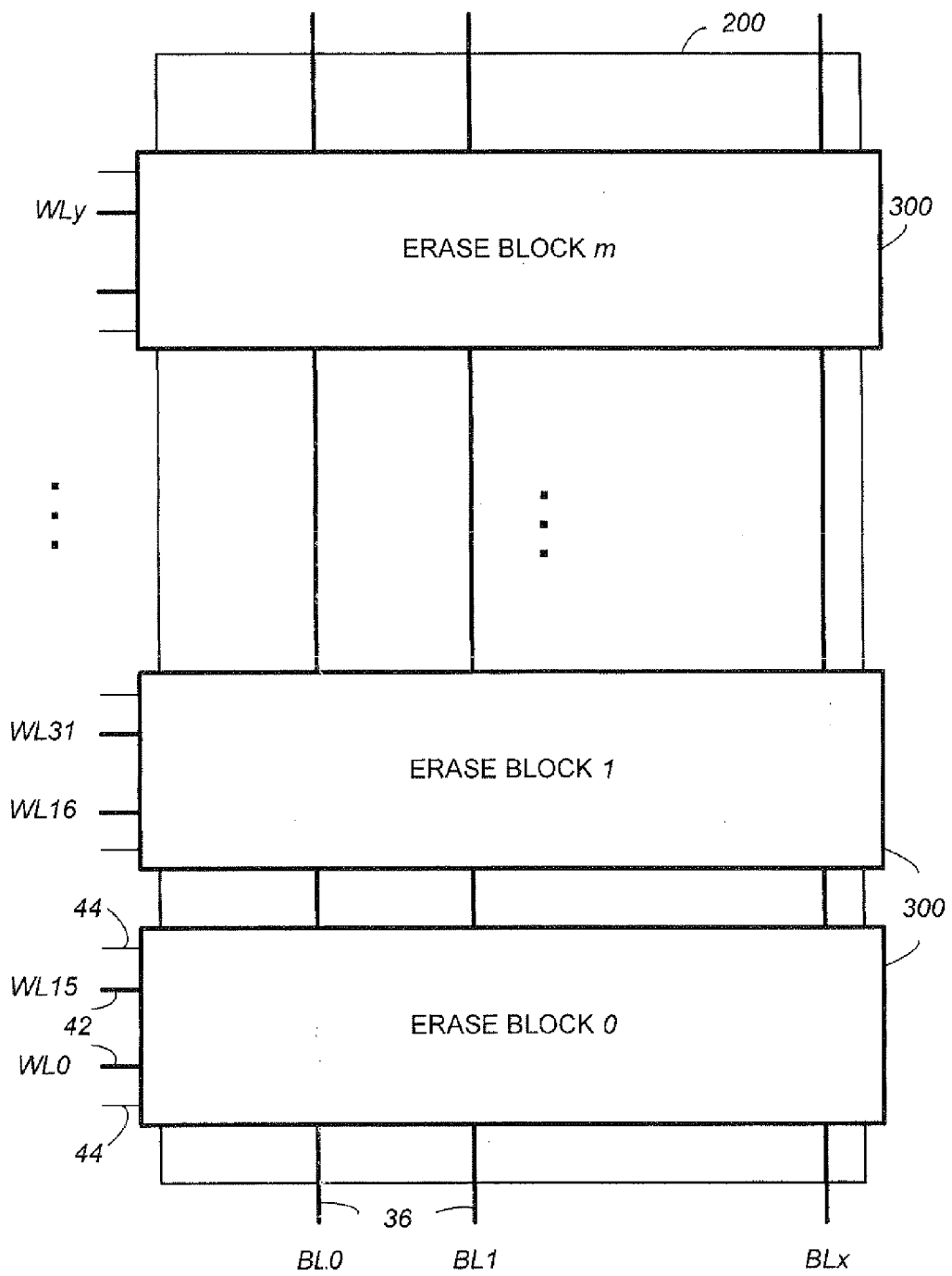
FIG. 3 illustrates schematically an example of a memory array organized in erasable blocks.

FIG. 3 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 3, individual memory cells in the memory array 200 are accessible by word lines 42 such as WL0-WLy and bit lines 36 such as BL0—BLx. The memory is organized into erase blocks, such as erase blocks 0, 1, . . . m. If the NAND string 50 (see FIG. 2) contains 16 memory cells, then the first bank of NAND strings in the array will be accessible by select lines 44 and word lines 42 such as WL0 to WL15. The erase block 0 is organized to have all the memory cells of the first bank of NAND strings erased together. In memory architecture, more than one bank of NAND strings may be erased together.

Increased Parallelism with Metapage and Metablock Organization

Figure 4:
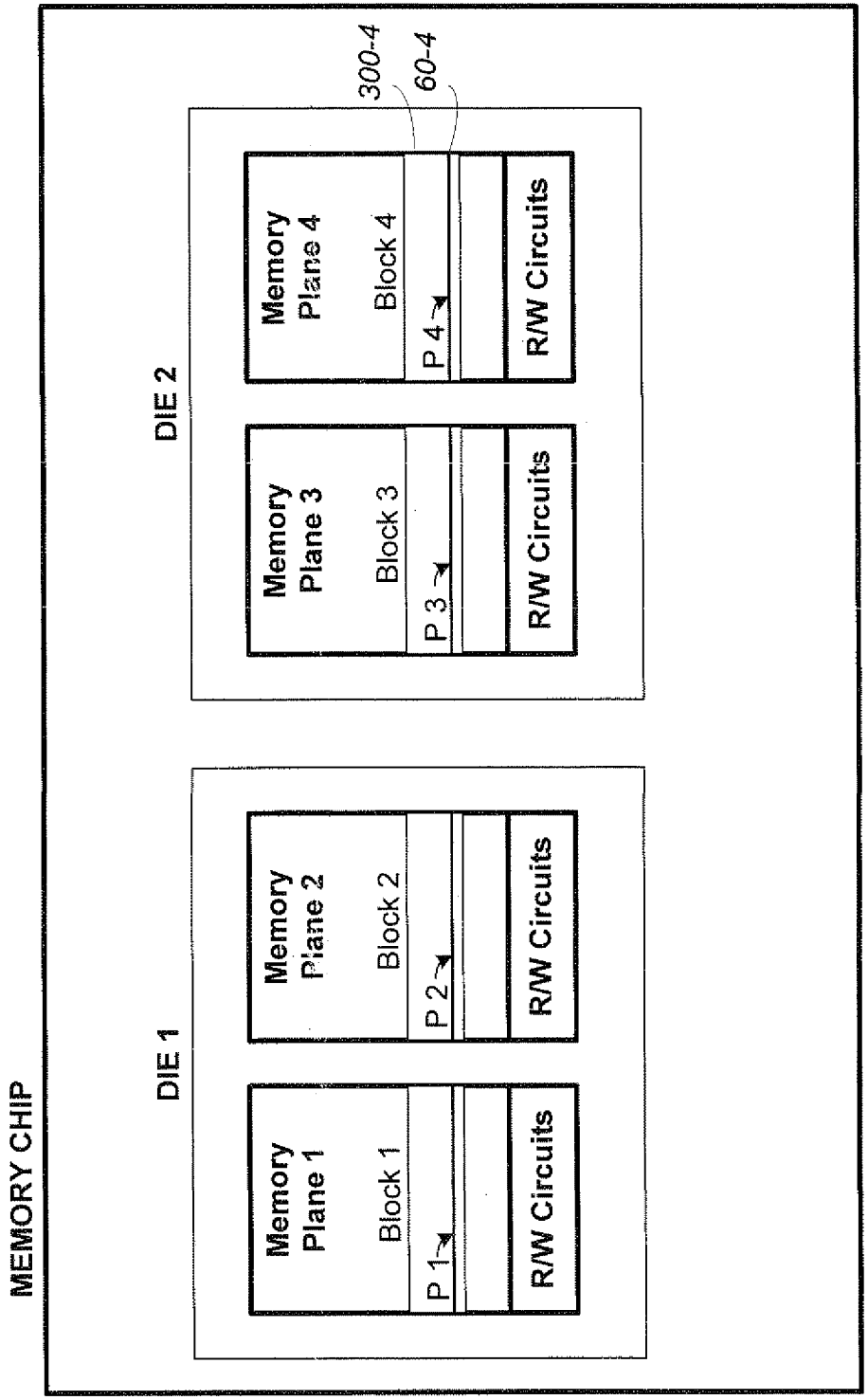
FIG. 4 illustrates schematically a memory chip having multiple arrays and operations for maximum parallelism.

FIG. 4 illustrates schematically a memory chip having multiple arrays and operations for maximum parallelism. For example, the memory chip is fabricated with two dies, DIE 1 and DIE 2. Each die contains two memory planes. For example, DIE 1 contains memory plane 1 and memory plane 2, and DIE 2 contains memory plane 3 and memory plane 4. Each memory plane contains multiple blocks and each block contains multiple pages. For example, memory plane 1 includes Block 1 which in turn includes a page P1.

The blocks such as Block 1-Block 4 are each minimum erase units (MEUs) fixed by the physical architecture of the memory array in a memory plane, such as the block 300 shown in FIG. 3. Similarly, the pages such as P1-P4 are each minimum Read/Write units fixed by the number read/write circuits that operate in parallel.

In order to maximize programming speed and erase speed, parallelism is exploited as much as possible by arranging for multiple pages of information, located in multiple MEUs, to be programmed in parallel, and for multiple MEUs to be erased in parallel.

Figure 5:
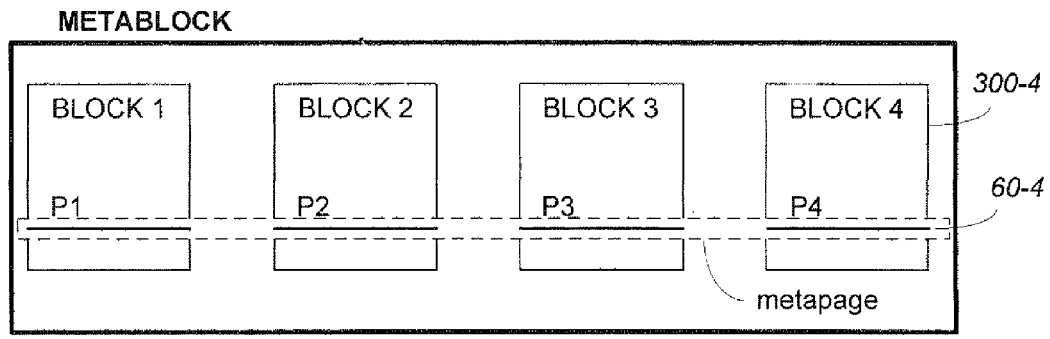
FIG. 5 illustrates schematically, a memory structure having higher degree of parallelism.

FIG. 5 illustrates schematically, a memory structure having higher degree of parallelism. For example, pages P1-P4 are linked together as a "metapage", which at the system level, is operated on as a minimum unit of read or write. Similarly, Block1-Block 4 are linked together as a "metablock", which at the system level, is operated on as a minimum erase unit. The physical address space of the flash memory is treated as a set of metablocks, with a metablock being the minimum unit of erasure. Within this specification, the terms "metablock", e.g., 300-4 and "block" 300 are used synonymously to define the minimum unit of erasure at the system level for media management, and the term "minimum erase unit" or MEU is used to denote the minimum unit of erasure of flash memory. Similarly, the terms "metapage", e.g., 60-4 and "page" 60 are used synonymously with the understanding that a page can be configured into a metapage at the system level with a higher degree of parallelism.

While FIG. 4 illustrates that higher degree of parallelism can be achieve by aggregating memory structures from multiple planes in a memory chip, it should be understood that in another embodiment, the planes may be distributed among more than one memory chip.

The linking and re-linking of MEUs into metablocks is also disclosed in United States Patent Publication No. US-2005-0144516-A1 and U.S. Pat. No. 7,139,864, the entire disclosure of these two publications are hereby incorporated herein by reference.

Examples of Binary (SLC) and Multi-level (MLC) Memory Cells

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states, for a memory cell. The multiple memory states can be coded by one or more binary bits.

Figure 6:
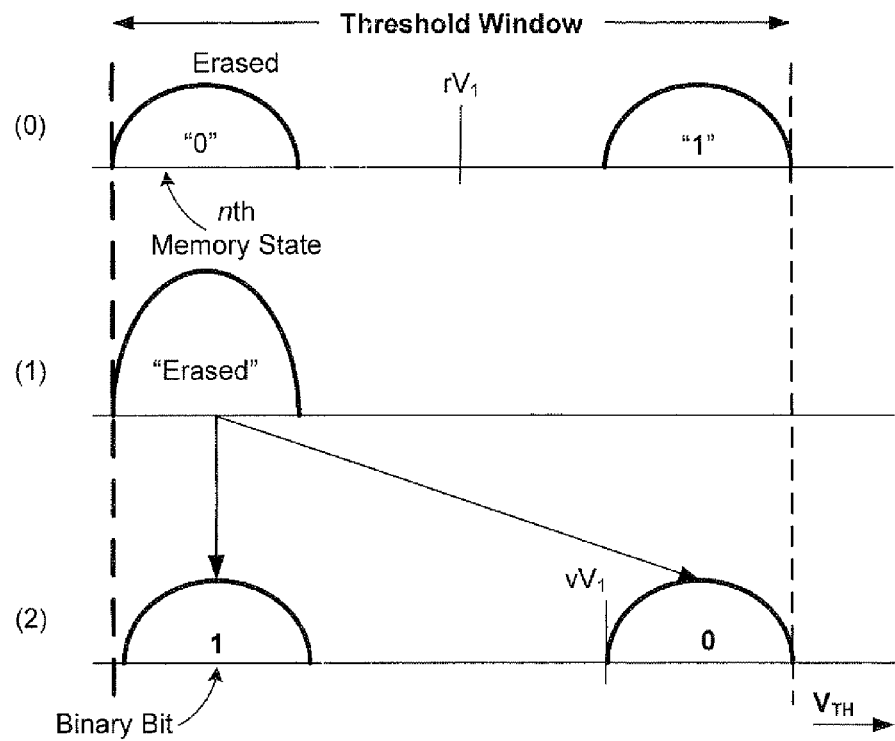
FIG. 6 illustrates a binary memory having a population of cells with each cell being in one of two possible states.

FIG. 6 illustrates a binary memory having a population of cells with each cell being in one of two possible states. Each memory cell has its threshold window partitioned by a single demarcation level into two distinct zones. As shown in FIG. 6(0), during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. FIG. 6(1) illustrates the memory initially has all its cells in the "erased" state. FIG. 6(2) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 7:
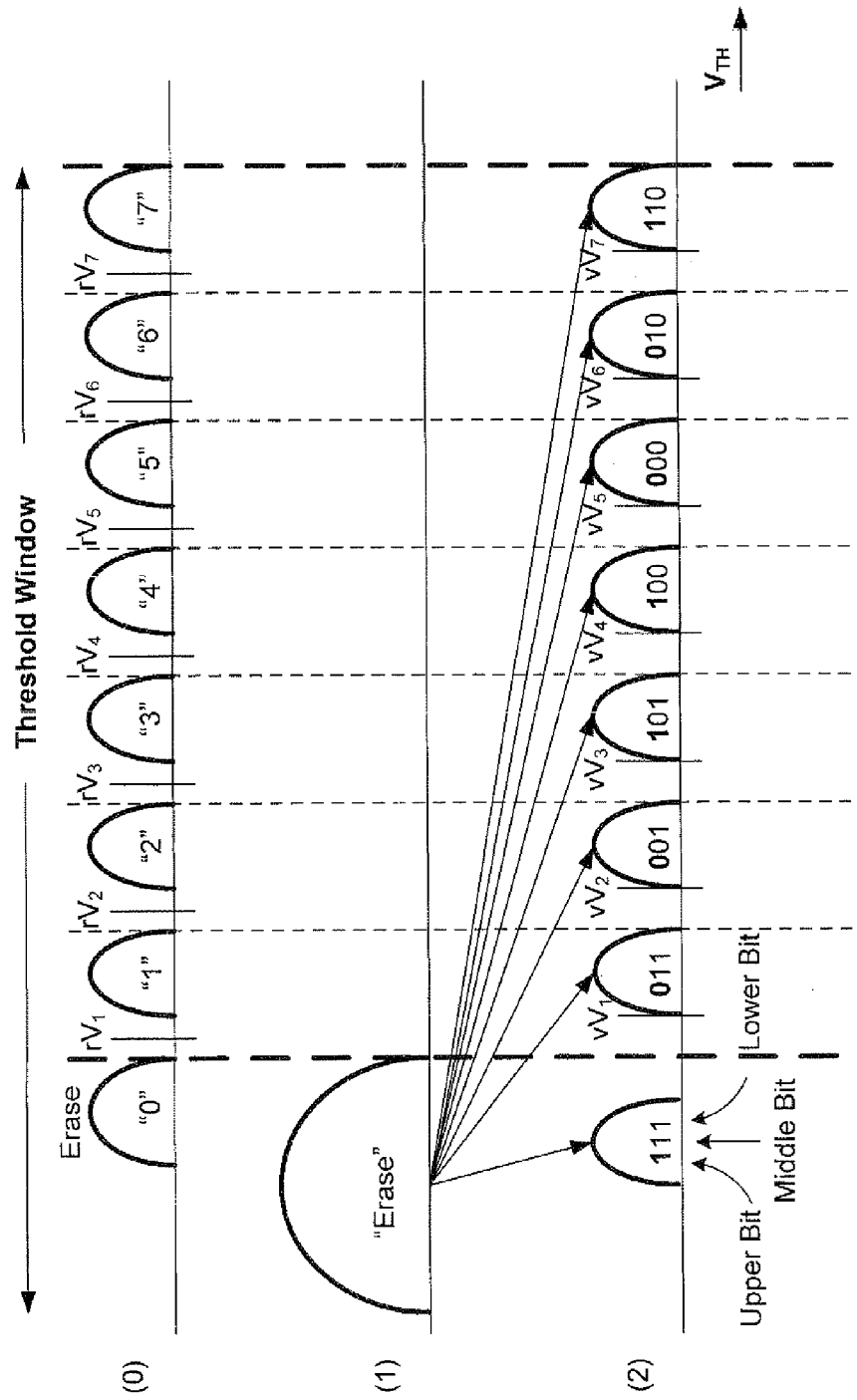
FIG. 7 illustrates a multi-state memory having a population of cells with each cell being in one of eight possible states.

FIG. 7 illustrates a multi-state memory having a population of cells with each cell being in one of eight possible states. Each memory cell has its threshold window partitioned by at least seven demarcation levels into eight distinct zones. As shown in FIG. 7(0), during read, read demarcation levels $rV_1$ to $rV_7$ are used to determine to which zone the threshold level of the cell lies. The cell is in an "erased" state if its threshold is located in the lowest zone and is in one of multiple "programmed" states if its threshold is located in the upper zones. FIG. 7(1) illustrates the memory initially has all its cells in the "erased" state. FIG. 7(2) illustrates some of cells being programmed to the "programmed" state. A 3-bit code having lower, middle and upper bits can be used to represent each of the eight memory states. For example, the "0", "1", "2", "3", "4", "5", "6" and "7" states are respectively represented by "111", "011", "001", "101', "100", "000", "010" and '110". Typically programming is performed by application of one or more programming voltage pulses. After each pulse, the cell is sensed to verify if the threshold has moved beyond a reference which is one of verify demarcation levels $vV_1$ to $vV_7$. A memory with such memory cell partitioning is referred to as "multi-state" memory or Multi-level Cell ("MLC") memory. In a number programming method employs multiple programming passes before the cells are programmed to their target states in order to alleviate floating-gate to floating-gate perturbations.

Similarly, a memory storing 4-bit code will have lower, first middle, second middle and upper bits, representing each of the sixteen states. The threshold window will be demarcated by at least 15 demarcation levels into sixteen distinct zones.

As the memory's finite threshold window is partitioned into more regions, the resolution for programming and reading will necessarily become finer. Thus, a multi-state or MLC memory necessarily operates with a narrower margin of error compared to that of a memory with less partitioned zones. In other words, the error rate increases with the number of bits stored in each cell. In general, error rate increases with the number of partitioned zones in the threshold window.

Endurance is another problem with flash memory that limits its life of use. With every program/erase cycling, some tunneling electrons are trapped in the dielectric between the floating gate and the channel region that results in the narrowing of the threshold window. This will eventually result in program and read errors. Since MLC memory has lower tolerance for error, it also has less endurance compared to SLC memory.

Memory Partitioned into SLC and MLC portions

Figure 8:
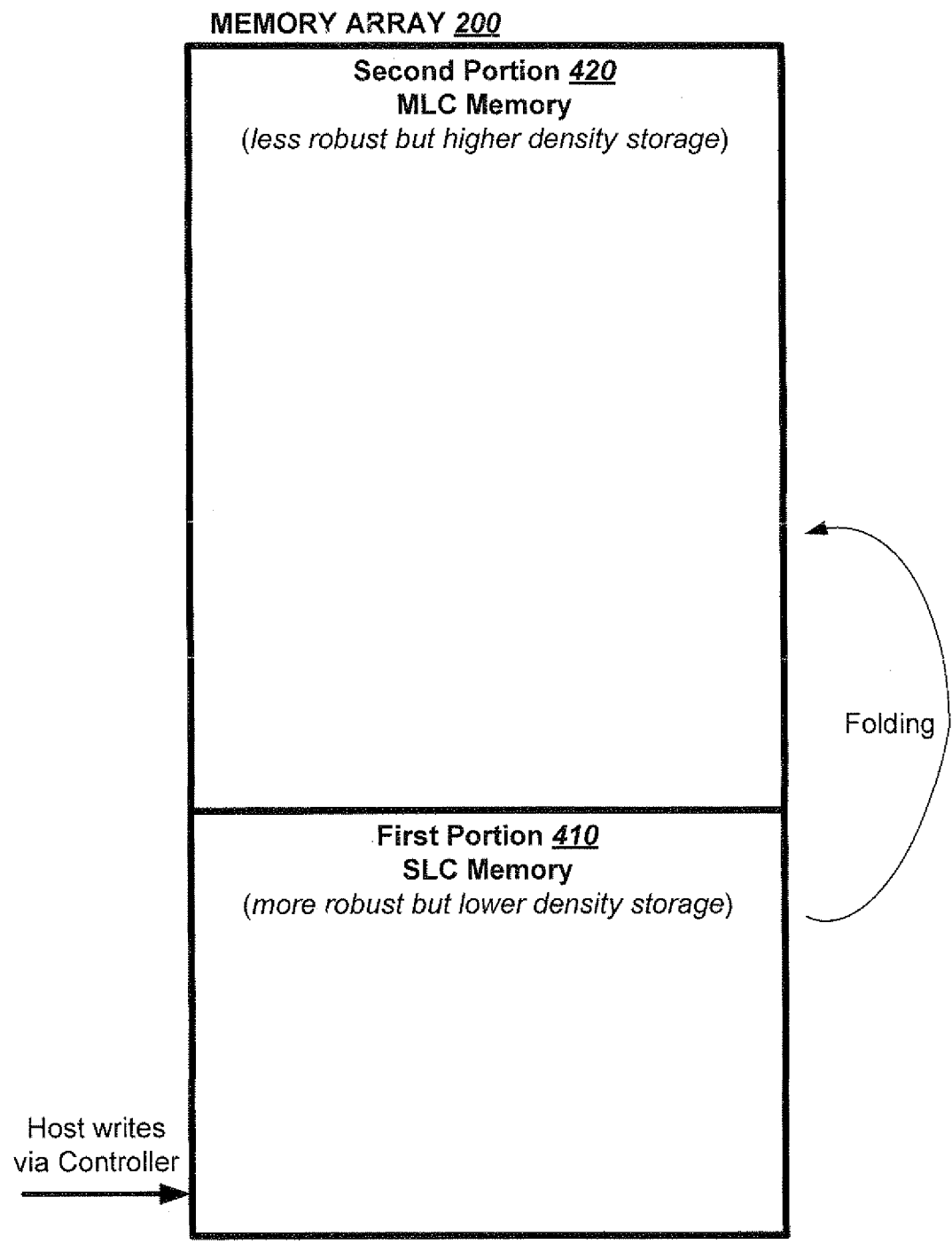
FIG. 8 illustrates an example of a physical memory architecture suitable for practicing the invention.

FIG. 8 illustrates an example of a physical memory architecture suitable for practicing the invention. The array of memory cells 200 (see FIG. 1) is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. For example, memory cells in the first portion 410 are configured as SLC memory to store 1 bit of data each. Memory cells in the second portion 420 are configured as MLC memory to store 2 bits of data each. The first portion storing 1 bit of data per cell will also be referred as D1 and the second portion storing 2 bit of data per cell as D2. In view of the discussion earlier, the first portion will operate with more speed, a much wider margin of error and more endurance compared to that of the second portion.

A memory partitioned into two portions such as into D1 (1-bit) and D3 (3-bit) portions is disclosed in U.S. application Ser. No. 12/642,584 filed on Dec. 18, 2009, the entire disclosure of which is incorporated herein by reference.

Figure 9:
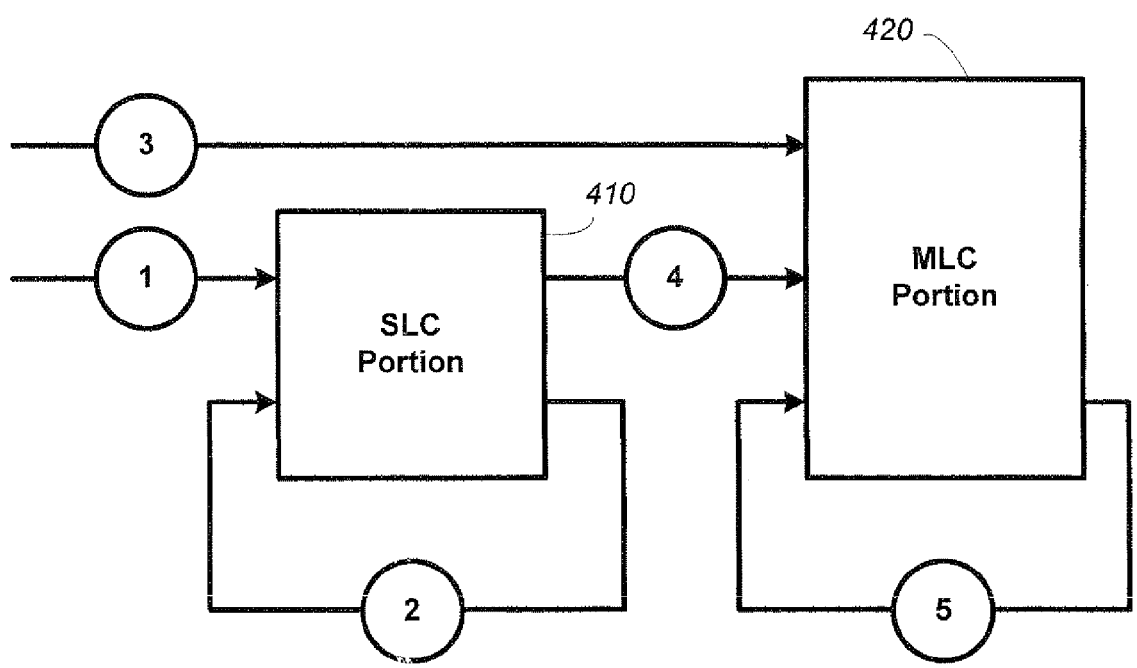
FIG. 9 illustrates schematically the data path between the SLC portion and the MLC portion in a 2-layer data storage system.

FIG. 9 illustrates schematically the data path between the SLC portion and the MLC portion in a 2-layer data storage system. The first layer is the main input buffer for incoming data and operates on the SLC portion 410 of a NAND memory which is faster/higher-endurance/higher-cost memory compared to the MLC portion 420. The second layer is the main data archive storage and operates on the MLC portion which is slower/lower-endurance/lower-cost memory.

The main operations in such system are labeled in FIG. 9 are as follows:
1. Host data or control data write to SLC portion
2. Data copy within SLC portion to reclaim partially obsolete SLC block, aka 'compaction'
3. Host data direct write to MLC portion, usually used for long sequential writes
4. Data move from SLC to MLC portion, aka 'folding'
5. Data copy within MLC portion for MLC block reclaim, aka 'MLC compaction'

The above structure can be built with many other additional features, mainly related to the use of different addressing schemes and addressable data unit granularity.

Figure 10:
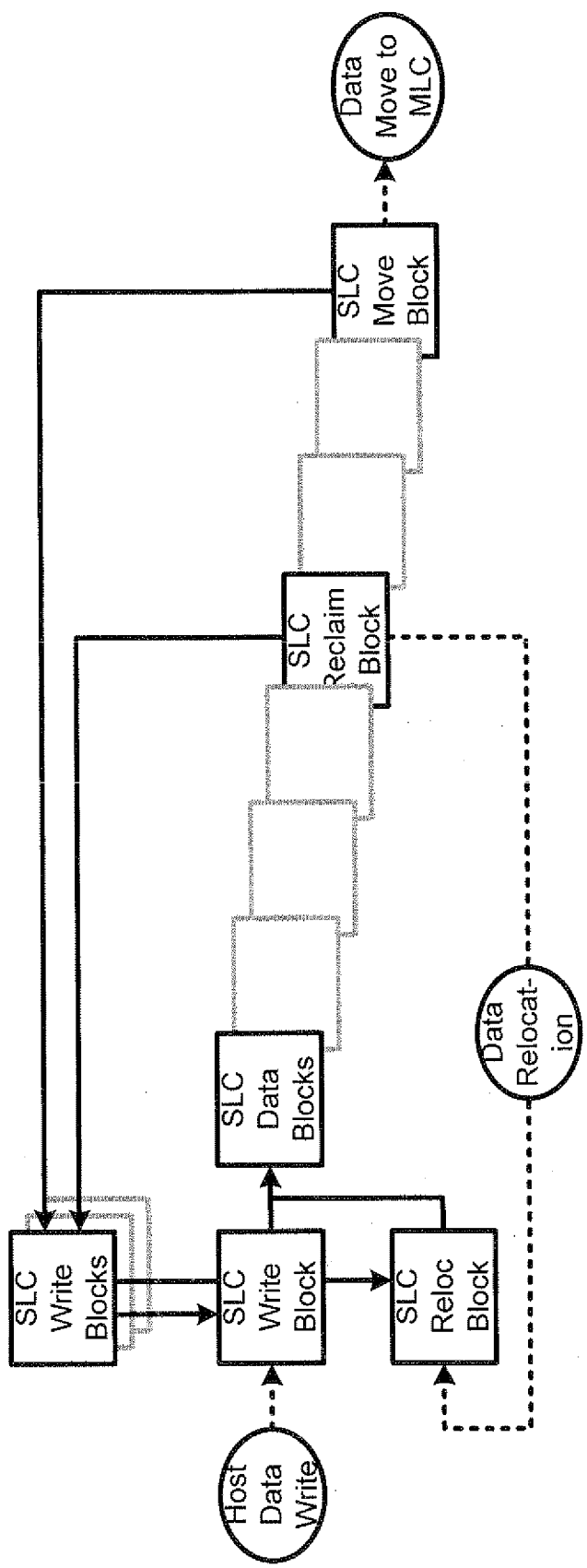
FIG. 10 illustrates in more detail the SLC layer shown in FIG. 9.

FIG. 10 illustrates in more detail the SLC layer shown in FIG. 9. The typical structure of SLC layer (see diagram above) uses multiple blocks, usually one Write/Update block data and one Relocation/Compaction block for data copied during block reclaim (or, they can be combined). The following main rules usually apply:
1. Blocks are linked in the chain according to the order in which they were programmed.
2. The least recently programmed block is selected as the SLC move/folding block, from which data may be moved/folded to the MLC write block.
3. The block with the lowest volume of valid data is selected as the SLC reclaim block, from which valid data is relocated to the SLC relocation block connecting to the head of the chain.
4. An SLC move block or SLC relocation block is added to the SLC empty block list on completion of a data move/folding or block reclaim operation.

In addition to that, the two-layer structure can be in fact more than two layer, if there are more types of memory, say RAM, or 3rd type of NVM.

Also, in the each 'memory' layer, there might be multiple sub-systems, with different data handling, which also referred to as 'layer'.

The prior art systems based on NAND memory usually have the following storage hierarchy. The SLC partition has SLC blocks to implement a Binary Cache and Binary Update blocks.

The Binary Cache is used for some or all data. Data is stored in the Binary Cache with fine granularity of 1 or 8 (4 KB) sectors. Typically, the Binary Cache is used to cache small and random fragments of a page. It is then evicted to the Binary Update block.

The Binary Update blocks map most of the data in units of Logical Group. Each Logical Group has a size that corresponds to the SLC block. So, one Binary block can store up to one Logical Group in which the pages are in sequential order of logical address. This layer does not exist in cluster-based systems, as in those systems all Binary blocks are used as Binary Cache.

The MLC partition has MLC blocks for storing the data in higher density than the SLC blocks. Typically, data is stored MLC-block by MLC-block. Thus in a memory with D1 and D3 partitions, 3 SLC blocks is folded (relocated) to 1 MLC block.

Eviction of data from the Binary Cache to the SLC update blocks and to the MLC blocks is based on Least-Recently-Written basis. The problem in all systems that most of the data (exception is data updated while in binary Cache) is going to SLC blocks first so that it works pretty much as a FIFO buffer. Then all data go to MLC blocks. In both SLC and MLC portions, the data can be copied many times due to padding (to make a full addressing unit), or to compact blocks and reclaim obsolete space. The Stress Factor (aka Write Amplification) is high and applies to both SLC and MLC block partitions. The data in SLC is also allocated in MLC (double allocation), which increases required number of blocks in the system due to double-budgeting.

Generally in prior art systems, the main approach is to use finer granularity units, which assume high-end processing and large RAM requirements, adding extra cost and power consumption.

Also, very small unit, such as 4 KB, creates a problem of the data being fragmented, scattered between the blocks so much that maximum parallelism during read and data copy (due to update) is not achievable. Also, amount of copy increases as small update can trigger copy of an entire block(s).

Block Management System Using Small Logical Groups With Selective Distribution Across Memory Partitions Based on Activity Small Logical Groups The invention has an architecture which addresses the above problems, in particular the undesirable FIFO buffer behavior of SLC blocks which increases write amplification; the fragmentation of data, which reduces parallelism; the high intensity of processing, which requires large RAM and high power; the duplicate capacity budget for data in SLC blocks, which is inefficient and wasteful.

According to one aspect of the invention, a nonvolatile memory is provided with a block management system in which an ordered logical address range from a host is partitioned into logical groups where a block stores multiple logical groups of data. Each logical group is of a size having a range from at least the same order of magnitude to an order of magnitude higher as the size of a host write but at least of a size of a page or metapage which is a unit of read or write of maximum parallelism supported by the memory. By having the size of the logical group decoupled from that of the erase block, and being of a size more compatible with the size and nature of host writes, the logical group provides the benefit of simplifying addressing and conserving limited system resource while not triggering excessive rewrites which impact performance.

The implementation of logical groups of smaller size has the benefit of not triggering excessive rewrites while at the same time allowing a smaller address table to be used. This has the benefit of the address table being of sufficiently compact size to be cached in RAM integrated on a controller chip without the need for costly external RAM.

Figure 11:
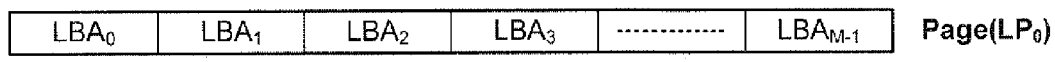
FIG. 11 illustrates a page in the memory organization of the block management system according to the present invention.

FIG. 11 illustrates a page in the memory organization of the block management system according to the present invention. Essentially, a host writes units of data which are identified by their logical address, LBA (logical block address). The memory operates on a logical page 62 of data in parallel. The page 62 can hold data for a number of LBAs. For example, each page holds data from M units of LBAs and a page, Page($LP_0$), may be filled with data from $LBA_0$ to $LBA_{M-1}$. Depending on the memory architecture a page is at least a group of cells/data that can be serviced by a corresponding group of read/write circuits in a memory plane. In the preferred embodiment, the page is a metapage as described in connection with FIG. 5 to achieve maximum parallelism. For example, the metapage is of size 32 kB to 64 kB. With a host write cluster of 4 kB, a metapage can hold 8 to 16 clusters.

Figure 12:
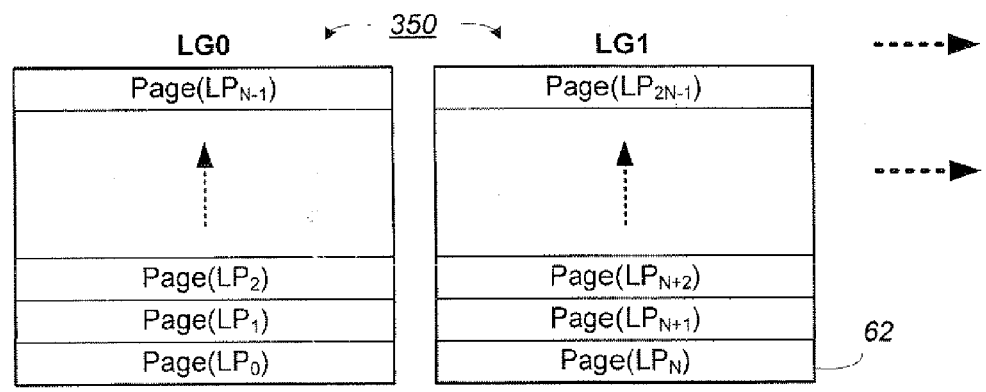
FIG. 12 illustrates a logical group in the block management system.

FIG. 12 illustrates a logical group in the block management system. For simplicity of addressing, instead of tracking each page 62 independent, a group of pages is tracked as one unit. Essentially, the logical addressed space of the host system is partitioned into logical groups 350, each group being a subset of the logical address space defined by a range of LBAs or logical page numbers. For example, logical group LG0 is constituted from N logical pages with logical page nos. $LP_0$ to $LP_{N-1}$ and the next logical group LG1 is constituted from N logical pages with logical page nos. $LP_N$ to $LP_{2N-1}$, etc.

A logical group 350 is stored in the memory with its logical page numbers in sequential order so that the pages in it are self-indexed. In this way, addressing for the pages 62 in the logical group is by simply keeping track at the logical group level instead of the page level. However, with updates of pages in a logical group, garbage collection needs to be performed to reclaim space occupied by invalid pages. In prior art systems, the logical group has a size that aligns with the size of an erase block. In this way, garbage collection on an erase block is simply to salvage the valid data of the logical group and rewrite the entire logical group to a new block.

Figure 13A:
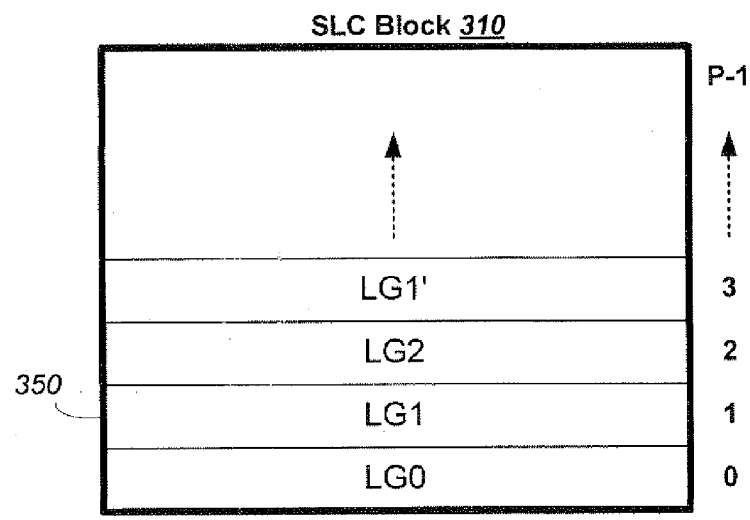
FIG. 13A illustrates an erase block accommodating data from multiple logical groups.

FIG. 13A illustrates an erase block accommodating data from multiple logical groups. Unlike, prior art systems, the size of the logical group 3350 is decoupled from that of the erase block and is not the same size as the erase block. The logical group 350 is down-sized to be more compatible with the size and nature of host writes. A. block 310 (which preferable is a metabloek) in the SLC portion 410 is able to accommodate data for P number of logical groups. For example, the SLC block stores the following logical groups: LG0, LG1, LG2, LG1', . . . , etc where LG1' is an updated version of LG1.

By using logical groups, addressing is less intense and places less demand on system resources without requiring an expensive off-chip RAM to work with the memory controller.

Figure 13B:
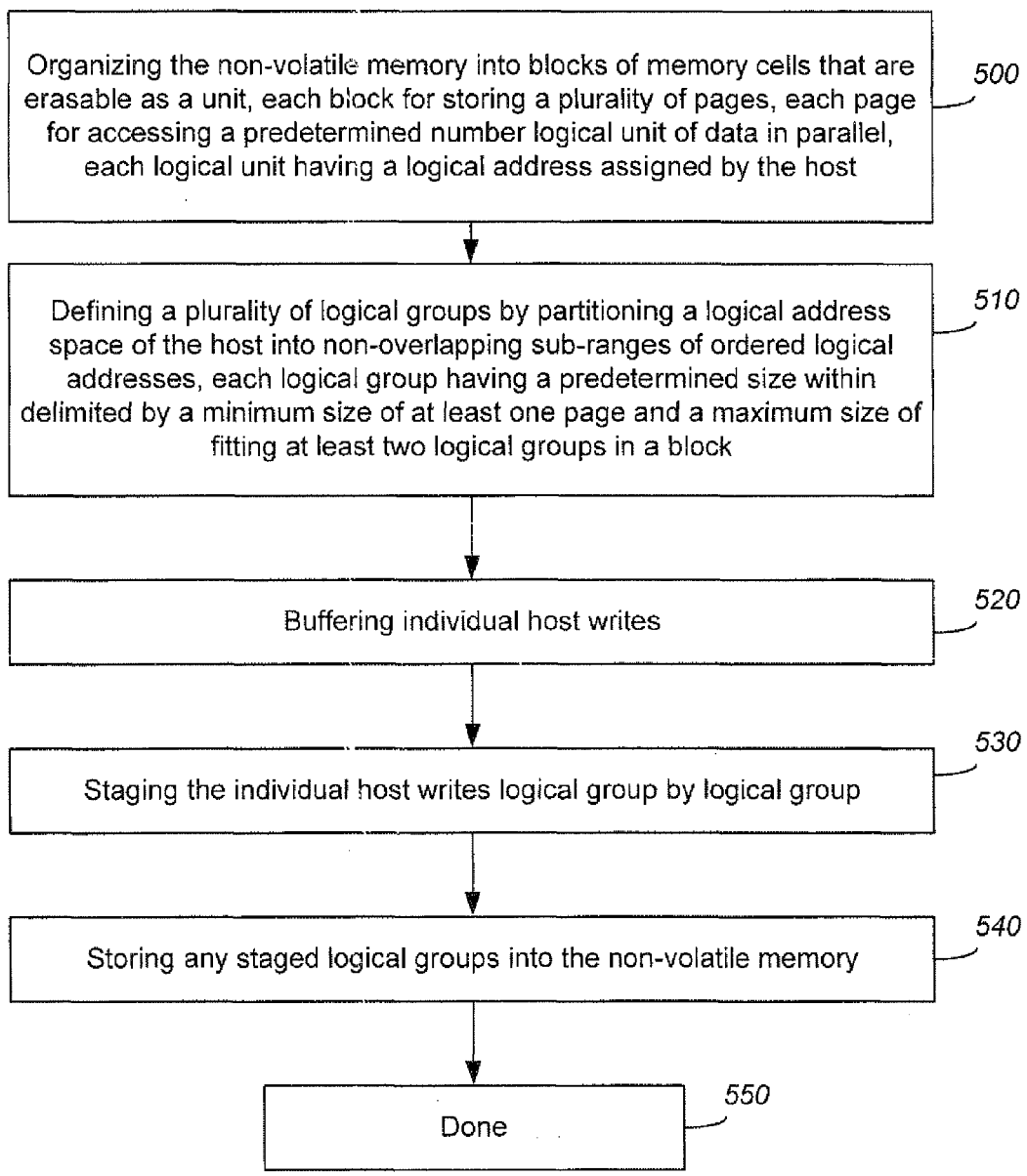
FIG. 13B is a flow diagram illustrating the scheme of storing host writes to the non-volatile memory in terms of small logical groups.

FIG. 13B is a flow diagram illustrating the scheme of storing host writes to the non-volatile memory in terms of small logical groups.

However, as erase block size is increasing with every generation of flash memory, prior art approach of aligning a logical group with a block results in a system that is not optimized for short and random host writes. This type of host write patterns are prevalent in applications under desktop and laptop computers and smart mobile devices. These data patterns, characterized by frequency updates and non-sequential writes, tend to cause more frequent rewrites of the memory in order to maintain the logical group sequential order. In other words, the prior logical group size causes a great deal of write amplification and degrade performance and wear out the memory prematurely.

Thus, each logical group is down-sized to a range from at least the same order of magnitude to an order of magnitude higher as the size of a unit of host write but at least of a size of a metapage which is a unit of read or write of maximum parallelism supported by the memory. This will be optimized for data patterns that are frequently updated or non-sequential and not to trigger excessive rewrites. For example, a logical group may have 4 metapages. If the metapage holds 8 to 16 host clusters, then a logical group may hold 32 to 64 clusters. At the same time, the logical group size may be judicially increased as a tradeoff for the purposed of relieving demand on addressing resource so that the controller chip need not operate with external RAM.

FIG. 13B is a flow diagram illustrating the scheme of storing host writes to the non-volatile memory in terms of small logical groups.

STEP 500: Organizing the non-volatile memory into blocks of memory cells that are erasable as a unit, each block for storing a plurality of pages, each page for accessing a predetermined number logical unit of data in parallel, each logical unit having a logical address assigned by the host.

STEP 510: Defining a plurality of logical groups by partitioning a logical address space of the host into non-overlapping sub-ranges of ordered logical addresses, each logical group having a predetermined size within delimited by a minimum size of at least one page and a maximum size of fitting at least two logical groups in a block.

STEP 520: Buffering individual host writes.

STEP 530: Staging the individual host writes logical group by logical group.

STEP 540: Storing any staged logical groups into the non-volatile memory.

STEP 550: Done.

In a preferred implementation, the memory is partitioned in SLC and MLC portions and comprises, first, second and third operational and functional layers. The first and second layers operate in the SLC portion. The third layer operates in the MLC portion. The first layer is for initially storing write data from a host and staging the data logical-group by logical-group before relocating each logical group into either the second or third layer. The second layer provides active storage in a pool of SLC blocks for storing host data at the logical-group level. When the pool is full, more room is made by evicting the logical groups with the least potential rewrites to the third layer which stores at a higher density.

Figure 14:
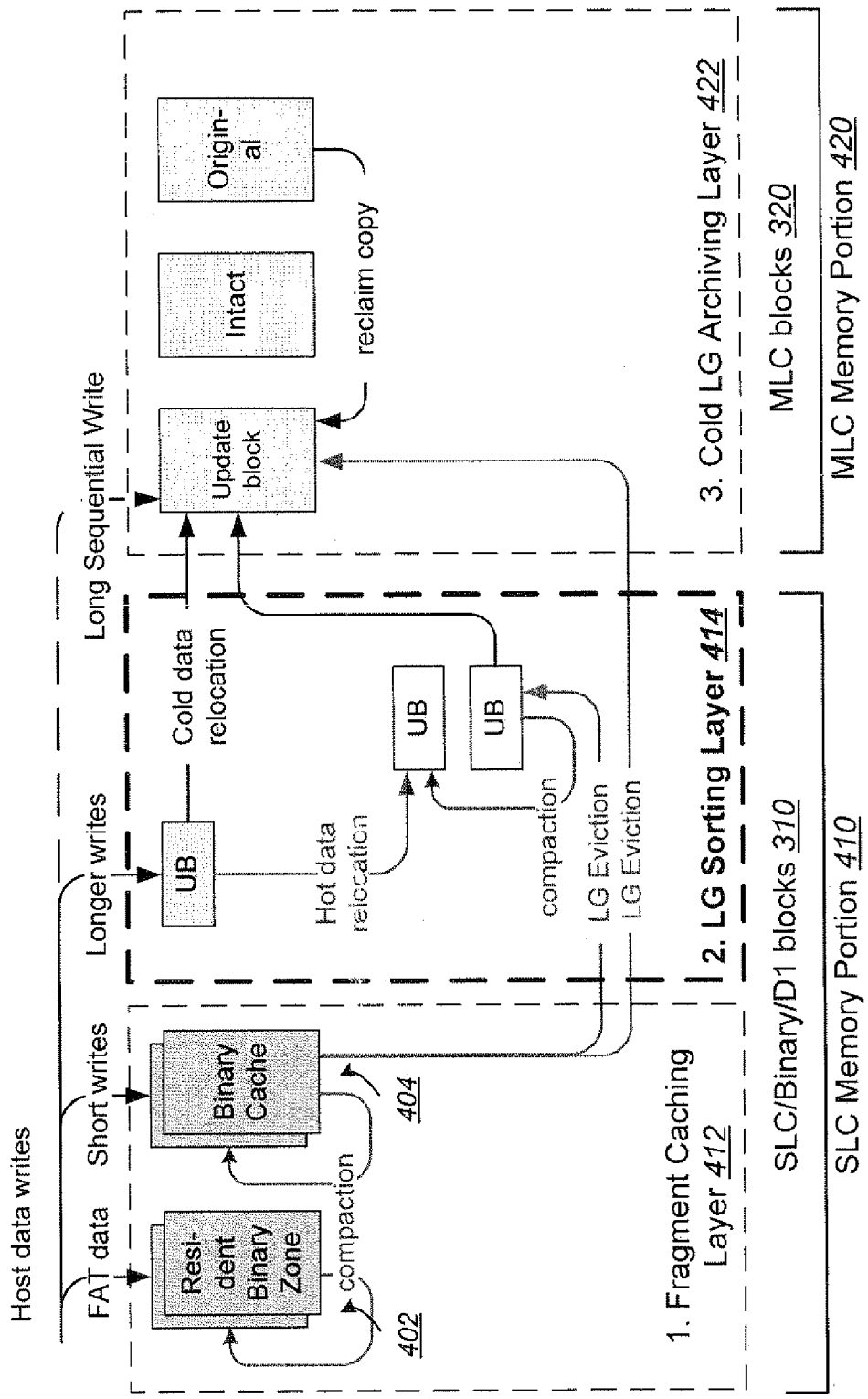
FIG. 14 illustrates a system architecture for managing the blocks and pages across the different memory partitions according to the present invention.

In this way an active set of user data is preferentially maintained in the faster SLC memory and only when capacity runs out in the SLC memory will selected logical groups more suited for storage in the MLC memory be evicted thereto FIG. 14 illustrates a system architecture for managing the blocks and pages across the different memory partitions according to the present invention. The blocks and pages in the memory arrays are managed by a block management system, which resides as firmware 60 in the memory controller 102 (see FIG. 1).

The memory is partitioned into a SLC portion 410 and a MLC portion 420. The block management system implements a first, fragment caching layer 412, a second, logical group sorting layer 414 and a third, cold logical group archiving layer 422. These are operational and functional layers. The first two layers 412 and 414 operate in the SLC portion 410 and the third layer 421 operates in the MLC portion 420.

The first, fragment caching layer 412 operates on binary blocks 310 of the SLC portion 410 and is for initially storing data from a host and staging the metapages logical-group by logical-group before relocating each logical group into the MLC portion 420. The staging is to gather the data into entire logical groups. The gathering could be from fragments of a host write or by padding in combination with existing data already stored in the non-volatile memory. The SLC portion 410 includes two structures: a resident binary zone 402 and a binary cache 404. The Binary Cache 404 is storage for mainly short fragments with fine addressing unit (sector), where the data can be moved/evicted to SLC blocks 310 or MLC blocks 320. The resident binary zone 402 is reserved for known frequently updated areas with short updates, typically NTFS or other File System tables data only.

The second, logical group sorting layer 414 stores data logical-group by logical-group in a pool of SLC update/storage blocks 310. The writes to this pool come from host writes or from rewrites due to garbage collection. If the host data is mainly of short fragment, it is first cached in the first layer 412 before being evicted from the first layer to the second layer 414. If the host data is less fragmented (medium size), where complete logical group can be had, it is written directly to the second layer 414.

Essentially, the second layer 414 provides a fast SLC storage area where fragmented and medium size host writes land. Unlike prior systems, where there is no second layer and the first layer 412 essentially acts as a FIFO to transit data to the third layer 422 in the MLC portion 420 before the data can be accessed, this second layer 414 maintains a working set of user data in the fast SLC portion 410.

Thus, a user will experience high performance writes as the pool of SLC update/storage blocks are being filled. Only when the pool is full will the system move some logical groups over to the third layer (MLC) to make room.

Hot/Cold Logical Group Sorting

A non-volatile memory organized into flash erasable blocks sorts units of data according to a temperature assigned to each unit of data, where a higher temperature indicates a higher probability that the unit of data will suffer subsequent rewrites due to garbage collection operations. The units of data either come from a host write or from a relocation operation. The data are sorted either for storing into different storage portions, such as SLC and MLC, or into different operating streams, depending on their temperatures. In general, the temperature sorting technique is operable in SLC as well as MLC portions. This allows data of similar temperature to be dealt with in a manner appropriate for its temperature in order to minimize rewrites. Examples of a unit of data include a logical group and a block.

In a preferred implementation, the memory is partitioned in SLC and MLC portions and comprises, first, second and third operational and functional layers. The first and second layers operate in the SLC portion. The third layer operates in the MLC portion. The first layer is for initially storing write data from a host and staging the data logical-group by logical-group before relocating each logical group into either the second or third layer. The second layer provides active storage in a pool of SLC blocks for storing host data at the logical-group level. When the pool is full, more room is made by evicting the logical groups with the least potential rewrites to the third layer which stores at a higher density.

Each logical group in the second layer is ranked by its potential for future rewrites due to garbage collection. A temperature from a finite range is assigned to each logical group with the coldest logical group first to be evicted to the third layer. Ranking criteria include the rate of update the logical group is experiencing and the length of time the logical group is between updates. Logical groups relocated from the second memory layer to the third memory layer will be accessed at the third memory layer. Logical group remaining at the second memory layer will be accessed directly at the second memory layer.

Figure 15:
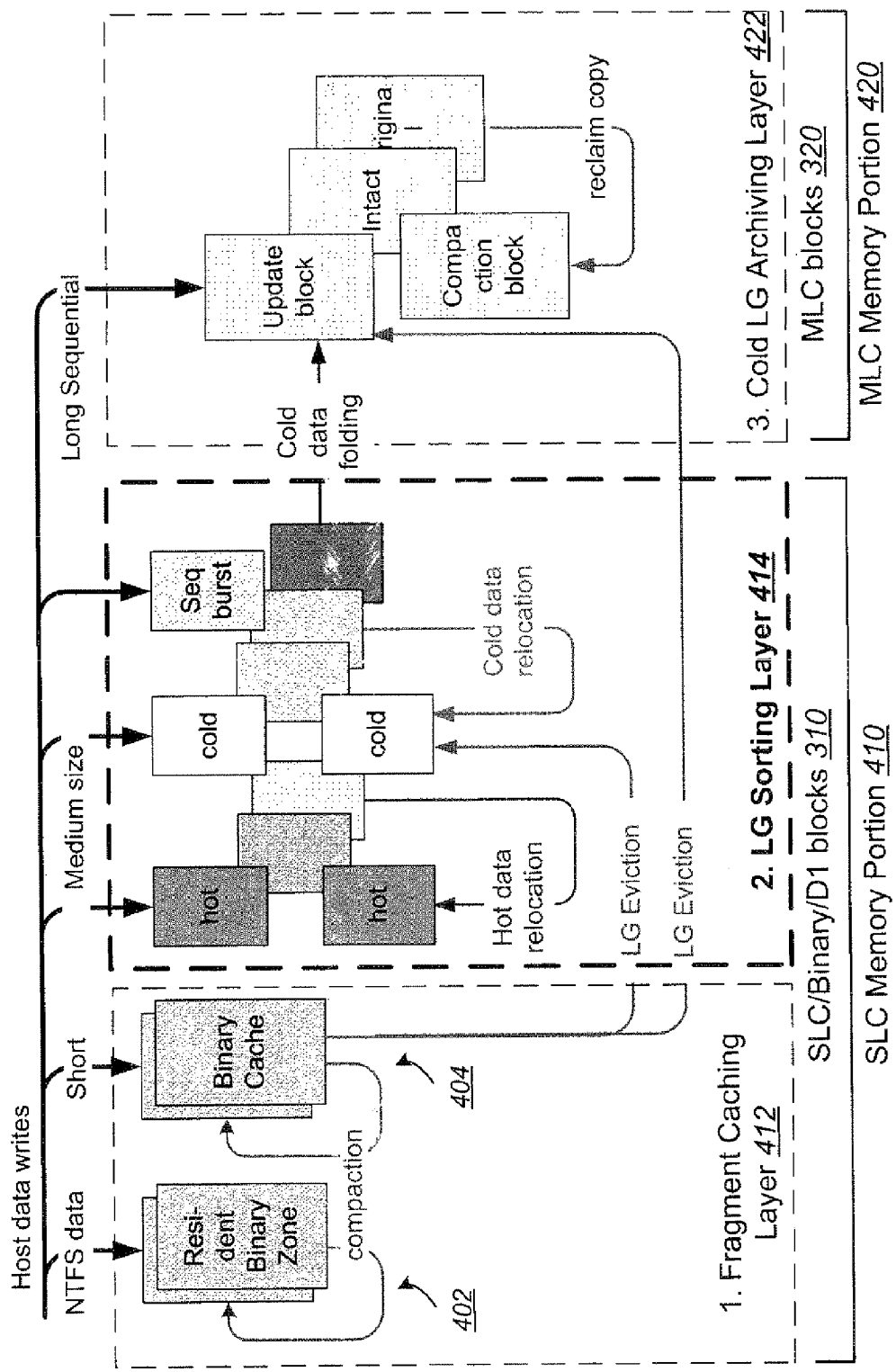
FIG. 15 illustrates in more details the second layer shown in FIG. 14.

FIG. 15 illustrates in more details the second layer shown in FIG. 14. A pool of binary blocks 310 is provided for storing the logical groups. As each block 310 is filled and some of the logical groups in it are updated, the block will need to be garbage-collected. Valid logical groups in the block are relocated to a new block. The logical groups in the pool are sorted according to its 'temperature'.

The logical group to be moved to the third layer 422 is selected according to its 'temperature'. The second layer 414 also provides facilities for ranking and sorting the logical groups by how likely they need rewrites. A logical group is considered 'hot' when it contains data that is frequently updated and is from short and random host writes because the logical group will need more rewrites due to more garbage collections. Conversely, a logical group is considered 'cold' when it contains data that is seldom updated and is long sequential host writes because the logical group will remain relatively static requiring little or no rewrites. One 'temperature' ranking criterion is the rate of update the logical group is experiencing.

Thus, whenever the SLC block pool in the second layer 414 is full, the logical groups with the coldest temperature are preferentially evicted to the MLC pool in the third layer 422.

Logical groups relocated from the second layer 414 to the third layer 422 will be accessed at the third layer 422. Logical groups remaining at the second layer 414 will continued to be accessed at the second layer 414.

The sorting and distinguishing of the actively updated and less actively updated logical groups are significant when the first 412 and second 414 layers operate in a SLC memory portion 410 and the third layer 422 operates in the MLC portion 420. By keeping the active logical groups in the SLC memory as a working set and only move the inactive ones to the MLC memory, rewrites of the logical group whenever there are updates to it are minimized in the MLC memory. This in turn minimizes the total number of rewrites a logical group will suffer.

The third layer 422 stores at a higher density (MLC) the coldest logical groups evicted from the second layer, This process is also referred to as 'folding' SLC data to MLC data.

The sorting of hot and cold logical groups and retaining the hotter logical groups in the second layer allows users to access these potentially performance-impacted data in the faster and more enduring SLC memory.

While the sorting scheme has been described with respect to sorting at the logical group level, it is to be understood that the invention is equally applicable to sorting at the level of other data units, such as sorting at the fragment level or sorting at the block level.

According to prior art systems, eviction of data from Binary Cache to SLC update blocks and to MLC blocks are based on Least Recently Written basis, applied on the block level. This means that it is actually based on Least Recently Programmed block, regardless of the fact how long ago the data was programmed by the host (the block can be programmed recently due to Compaction, but contain old and cold data.)

Also, eviction is often based (especially in Binary Cache) on operation efficiency criteria, with focus on increasing effect of individual operation, say Logical Group eviction yields most empty space.

The problem in all cases above is that they do not take into account the host update pattern, such as frequency of updates, and even how long ago the data was written. As a result, data which is likely to be accessed soon, may be archived.

U.S. Pat. No. 7,633,799 discloses usage of different data access pattern criteria such as LRU, hit rate by write and read commands. But, the prior art does not teach specific practical methods of making it work in a data storage system, such as making the choice efficient and at the same time avoid excessive processing, RAM and control update requirements.

The approach in the present invention is to aim for minimizing Write Amplification. Write amplification is caused by a future write elsewhere in the system. Write amplification is caused by co-location of active (hot) and inactive (cold) data being mixed in a physical block. Whenever, there is a mixing of hot and cold data in a block, the data in the block will eventually need to be relocated or rewritten to another block. As blocks get larger, it becomes more challenging to keep active and inactive regions co-located.

The invention provides a collection of practical methods to sort data in a way to detect the best data to evict/archive to the next layer of storage. The methods mainly use known principles, specifically they are based on analyzing access pattern and history. The focus is on making the data sorting practical.

The main methods include:

1. Rank the relative activeness of addressable data units (Logical Groups) by assigning a 'temperature' value to individual fragments. The Temperature value can be stored with the data itself or in a separate table, or alongside with addressing entries. The temperature values themselves can be based on:

a) Least Recently Written (by the host) criteria for the data fragments/units;

b) Recent Hit (access, e.g., read) rate;

c) Data fragment length (the shorter the data is, the more likely it is to be hit soon);

d) Number of block compactions copies for the data as an indicator of data age;

e) Combination of a) and b) and c), which produces the best results.

2. Provide a temperature value 'reduction'. For example, when measured over time, the hit rate may drop, which translates to a reduction in temperature. This allows a finite range of useful temperature to be defined and makes the use of the method practical. The temperature is reduced by the following methods:

a) Working within a limited dynamic range of temperature, (say 0=very cold, 7=very hot, in 3-bit temperature case) biasing the temperature to not go beyond the 0 values for extreme cold cases or saturating the temperature to not go beyond 7 at the extreme hot cases. In other word, all extreme cases have the same values, 0 or 7, after some point.

b) Leveling values of temperature values for fragments/units to avoid extreme saturation of values and loss of accuracy. In other word, using the limited dynamic range in a region of maximum effectiveness.

3. Using block-level temperature criteria, where the 'temperature' is tracked on a block level rather than on a fragment or Logical Group level. Two main cases include:

a) Tracking 'temperature' explicitly;

b) Implicit tracking by sorting blocks in the block list by data age or by degree of hotness/coldness.

In one embodiment, the temperature sorting is at the logical group level. The coldest logical group will be the first to be evicted from the second layer to the third layer. The criteria for a logical group to be evicted include the following.

1. Time stamps (TS). The temperature is determined as a time stamp value of the logical group. A time stamp indicates when the logical group was last written. The longer it was last written, the colder is the temperature. Practically using a limited TS range, very old logical groups beyond a maximum TS value will all be considered to have the same coldest temperature.

The advantage of TS is that it has the fastest response to access pattern change. The disadvantage is that it provides no previous history.

An example of using time stamp is to provide an 11-bit time stamp for each logical group in the binary block pool of the second layer. When a logical group is written to the pool, one option is to assign an initial time stamp value of 0 (bias=0). This may be suitable when the data written is long sequential data. Another option is to have a value of X (bias=X). This may be suitable for data of unknown type and X can be set to middle of the time stamp range. Every time there is a write of a logical group into the pool the time stamp of the logical group being written is set to the initial value and the time stamps of the existing logical groups in the pool are incremented by one. The time stamp for a logical group does not change during compaction. In this way, the time stamp provides a relative measure of how recently written is each of the logical groups in the pool.

2. Basic Write Counts. The temperature is determined as a write count of the logical group. A write count indicates how many times the logical group was written or the frequency of updates. For example, at a new update of the logical group, the write count is incremented. The advantage of write count is that it keeps history information. The disadvantage is that it may make old hot logical groups 'sticky'.

3. Temperature as a function of time stamp and write count. The initial temperature value of X is between 0 and Max when the logical group is first written. The value is incremented if the logical group is written again (as in write count), so the method adds bias to logical groups that are written more times recently. The value is decremented as the average value for all logical groups is going up by one (as approximate MSB of time stamp).

An example of assigning a 3-bit temperature as a function of time stamp and write count is as follows:

When the logical group is written, it has a temperature of X between 0 and Max (7). If the logical group is written again the temperature is incremented by one (as in a write count). The temperature is decremented under the following situation:

1. When the average temperature for all logical groups is going up by 1 as this can saturate on the top. This serves to level the population;
2. When there are no enough logical groups LGT=0 to evict;
3. When the average is going above a threshold (say MAX/2);
4. To level the ratio between 0s and MAXs Every time a Logical Group is updated by the host and is written to either Binary Cache or one of Update Blocks (upon completion of the previously written Logical Group in the same Update Block) is it assigned the following value of LGT:

Any Logical Group written to Sequential Stream gets assigned the lowest LGT value of 0.

If Logical Group is in the Active Binary set (addressed by Master Index), except of sequential write back-to-back by short writes without address jump, LGT value is incremented by 1 or set to Highest Cold LGT=3, whichever is the highest. The LGT value cannot exceed the Highest Cold value of 7.

If Logical Group is in not the Active Binary set (not addressed by Master Index), initial LGT value of Highest Cold LGT=3 is assigned.

When a Logical Group is written to one of Relocation Blocks it is assigned the default LGT value of Lowest Cold=0.

When a Logical Group is evicted from Binary Cache to one of Relocation Blocks it is assigned the LGT value of Highest Cold=3.

Only Logical Group with LGT=0 can be evicted and folded to MLC block. If there are no enough Logical Groups to be folded, all LGTs are to be decremented.

FIG. 16 illustrates the 'temperature' sorting of the logical groups for the 'hot' logical group case. LG temperature is a combined function of update frequency and age. The Active Binary Working Set (ABWS) is the pool of SLC blocks in the second layer. It represents the short list of Hot Logical Groups and blocks, where the LGT (Logical Group Temperature) values are being tracked.

Sorting is done on the basis of LGT (Logical Group Temperature) values for the Logical Groups. LGT values are stored for limited number of Logical Groups currently addressed by master index, making Active Binary set. The master index is a table that lists all the logical groups in the SLC pool of the second layer. Each LGT is 3 bit in size and has a range from 0 (coldest) to 7 (hottest).

All Logical Groups in ALL Streams are subject to Sorting, but only Logical Groups written to Binary blocks (Update Blocks, Relocation blocks, or stored in Closed Blocks) in the Active Binary Set (those currently addressed by Master Index) are being sorted at the given time and. LGT values are stored in Master index.

Logical Groups addressed via GAT (Binary Blocks in Inactive Binary Set and MLC blocks) are considered equally 'very cold' and by default are considered having lowest LGT value of 0. GAT is a lookup table that keeps track of the mapping between logical groups and blocks.

Initially, a given logical group that resides in an MLC block is updated. The temperature for this logical group therefore goes up from zero. As it is unclear how active this logical group will become in the near future, it is assigned a middle value temperature, with LGT=3. As it transpires, the logical group is soon updated another 5 times. With each update hit, the temperature LGT is incremented by one, which brings it to a maximum value of LGT=7. Thereafter, there were no further updates on the logical group and so LGT remains at LGT=7. At this point, it turns out that the binary pool is full and a set of logical groups with LGT=0 is evicted (folded) to the MLC layer. The departure of the set of logical groups raised the average temperature of the pool and therefore the temperature of all remaining logical groups in the SLC pool is decremented by one, so that the given logical group now has LGT=6. After a while with no updates to the given logical group, there is another folding, which will decrement the given logical group's LGT to 5. At this point, the given logical group has a high temperature and will continue to 'live' in the SLC pool.

FIG. 17 illustrates the 'temperature' sorting of the logical groups for the 'cold' logical group case. In this case, a logical group residing in the third, MLC layer is updated and returned to the binary pool in second, SLC layer. After sitting in binary pool without further updates, the temperature cools down back to LGT=0. When the pool is full and needs to evict some logical groups, the given logical group is folded back to the third, MLC layer.

In another embodiment, the sorting can be performed at the block level. This is an alternative approach if there are too many logical groups in the pool to individually track their temperature. Instead, the temperature is tracked at the block level where all logical groups in a block are treated as if they have the same temperature. The sorting options is this case include the following:

1. Same time stamp for logical groups in the same Binary block (explicit Block level TS)—to model
   Each Binary block has TS same for all logical groups written for the block.
   Sort hot and cold data by blocks
   TS=Current block TS. Current Block TS increments after each new data Update block closure.
   During compaction TS is approximated on the basis of TSs in the source blocks
   For example, the time stamp TS is 8 bits (compacted. TS=greatest TS of the first compaction source) or could be 6 bits (track average TS for compaction blocks).
   Can bias cold data, (TS=Current TS−bias), but not at the bottom, options are: bias=0 or bias=X.
2. Hot-Cold data Binary block sorting (implicit implementation of the Block level TS)—no need to model
   Each Binary block is listed in the UB info in time allocation order for new data update blocks. Equivalent to TS being the same for all logical groups written for the block.
   During compaction, the new block's position in the list is chosen approximately according to the source block locations. In other words, the new block has approximately the same temperature as the source block.
   During compaction TS is approximated on the basis of TSs in the source blocks
   Logical groups from the block at the end of the list get evicted
   The advantages are that it has no extra records, no overflow, no increments etc. Also it is very good for Binary Cache where there is no single table record, but multiple BCIs (binary cache indices), which are impossible to update all together. The disadvantage is that it requires data copies to re-sort block records.

The principles described above apply to a system with two or more layers of data storage, which can be non-volatile or mixed. The same rules can be applied to a specific type of storage in one of the layers, say Binary Cache sub-system or Update Blocks.

Advantage of this solution is that system performance impact is minimized and there is no increase in controller RAM space.

Block Streams to Separate Hot/Cold Data by LGT

In another embodiment, units of data are sorted according to their temperatures into different block streams such that the blocks in each operating stream only involves data of similar temperature. The goal is to separate hot data from cold data as soon as possible and at every opportunity. The hot data and cold data have different obsolescence and garbage collection/relocation schedules. For example, hot data will become obsolete faster and require more frequent garbage collection/rewrites. When the cold data are not mixed in with the hot data, it will not incur unnecessary rewrites. Most likely, the hot data will obsolete itself without triggering relocation of cold data from one block to another block, and the cold data in cold blocks will stay there without compactions/relocations due to the hot data.

One example is the host writes entering the pool of binary blocks in the second layer are sorted into different block streams as soon as possible. Another example is the data unit coming from a relocation operation.

Figure 18:
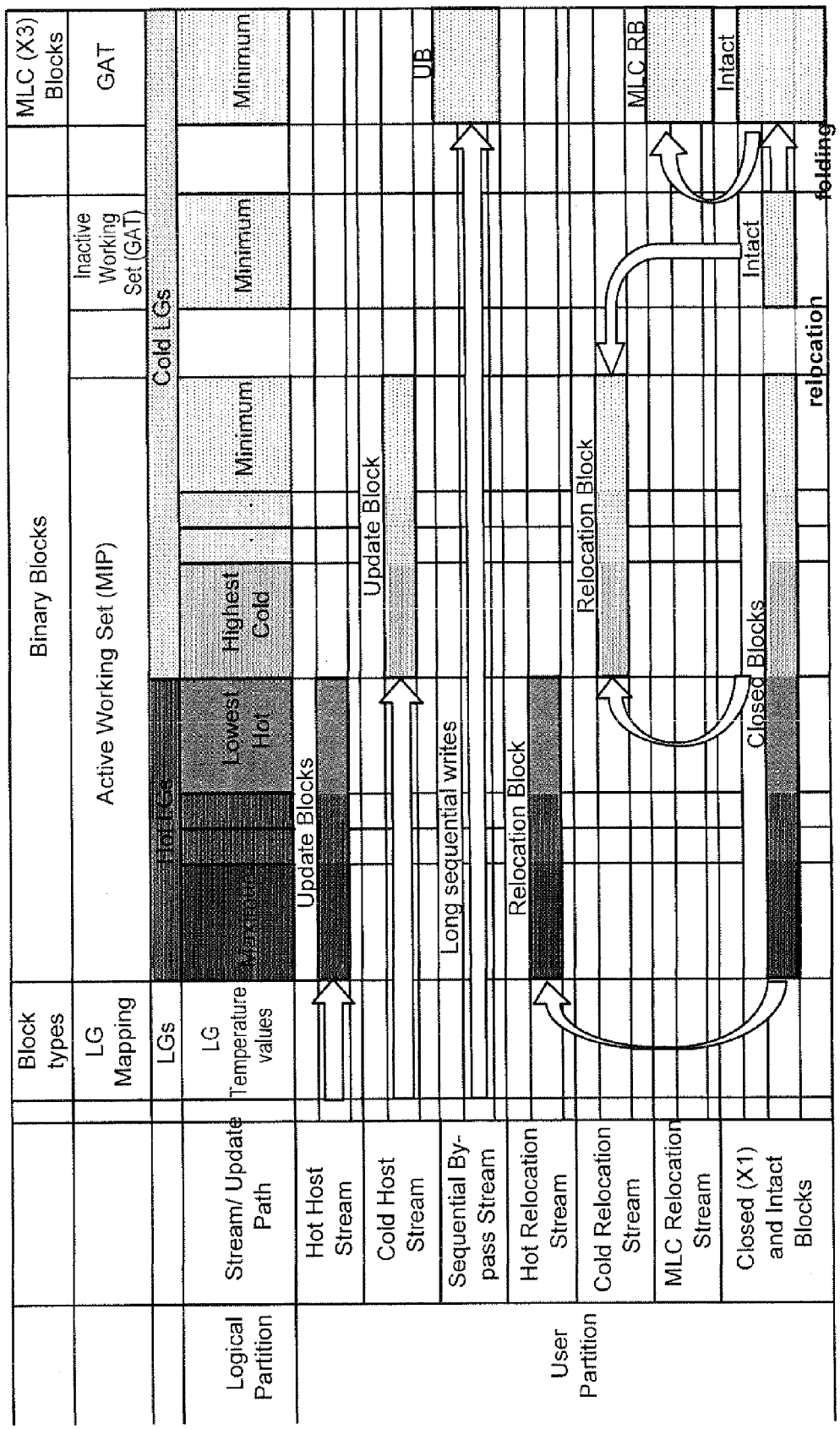
FIG. 18 illustrates how different types of writes are sorted into block streams according to their perceived temperature interactively.
Figure 18:
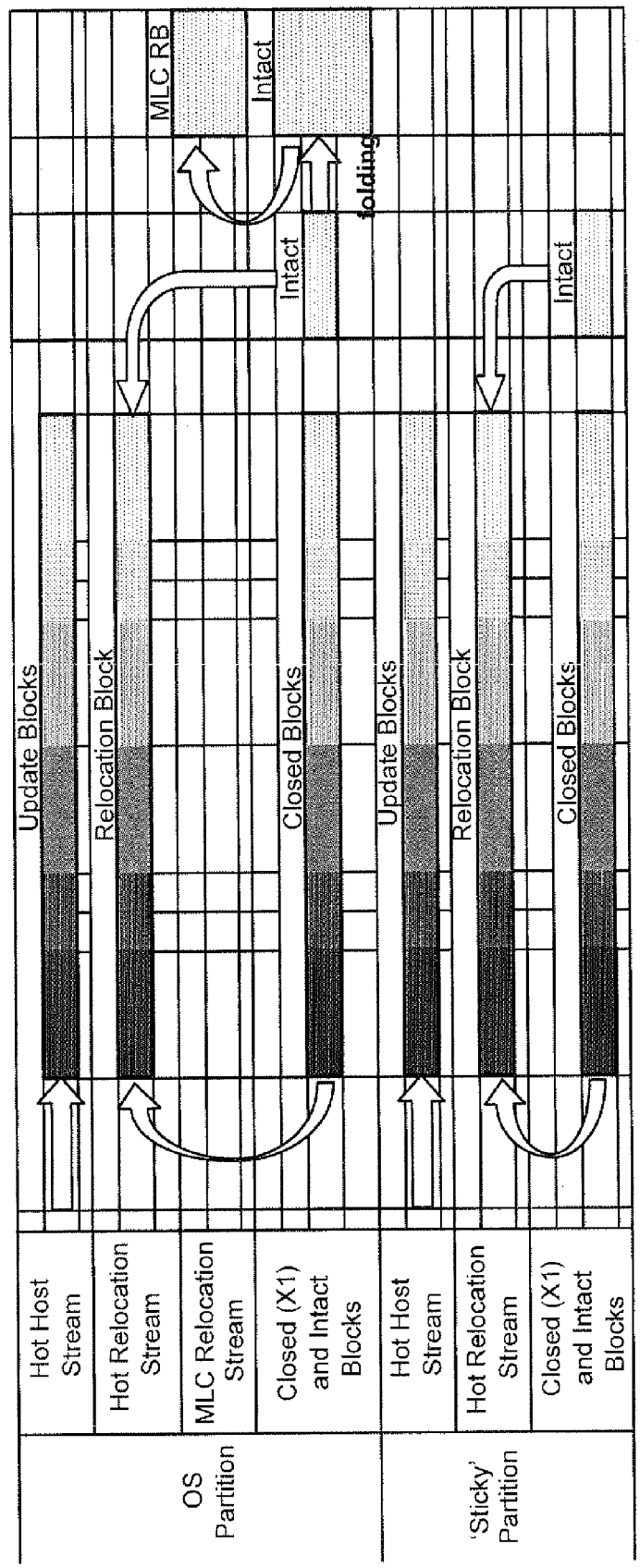

FIG. 18 illustrates how different types of writes are sorted into block streams according to their perceived temperature interactively. The sorting applies to the source at the second layer with incoming data and also applies to data moved by compaction to separate hot/cold blocks.

Generally, within a memory partition, there can be different type of data streams generated by different sources as shown. The data writes in each of the different types of data streams has its own update frequencies and randomness that could be sorted by a temperature described earlier.

In the binary block pool, the blocks are designated as either a 'hot' block for storing logical group with LGT>3 or a 'cold' block with LGT=<3. The temperature is determined on the fly after observing the write pattern. For example, when a logical group is written into the binary block pool for the first time, its temperature is unknown and therefore assigned a neutral temperate of LGT=3 (between 0 and 7, as the 3-bit example before). The logical group is written to a block designated to be cool. If the next write is an update of the logical group, the stream is deemed to be hot and the updated logical group is written to a different binary block for storing hot logical groups.

On the other hand, if the successive writes are sequential, the stream is deemed cold and the successive logical groups are all written to the cold binary block containing the first write.

If the successive writes are sequential and the trend continues for a predetermined period, the stream is deemed a series of long sequential writes and, is directed to be folded to the MLC portion either directly or via the binary block pool. In the direct case, the stream is in a by-pass mode as soon as it is identified. The head of the sequential stream marooned in a cold or even hot block will eventually be relocated.

The different data streams described above can be created by a user and therefore come from a user logical partition. Some of the write streams in the partition may also be created from relocation operations.

Partitions

In general, different logical partitions such as user partition, OS (operating system) partition and 'sticky' binary partition may be maintained, each with its own mix of different type of data streams, some with predetermined temperature. For example, in the OS partition, the system data are known to be fragmented and fast changing, so there is not even the need to determine the temperature. It is simply assigned a hot temperature and stored in the hot blocks. The same is true for the 'sticky' partition where the data there are meant to stay in the binary SLC portion. Thus its data stream is always 'hot' and is stored in the hot blocks.

Separate by LBA data to partition—meaning that a block does not have data coming from different partitions. The assumption is that data in different partitions is written by different applications (say OS in one, and user in another) and those writes often do not interleave. Say OS can write many commands, then user write many, but there is not a lot of interleave. By separating the writes from the different partitions to different blocks, compaction/relocation of, say, user data, triggered by OS writes, and vice versa, will be reduced.

Blocks and logical groups are subject to sorting by LGT without partition boundaries. That means that it is not necessary to budget a number of Closed blocks per partition, and the blocks are distributed on demand. For example, if the OS partition is active and the user partition is not, then up to all Closed update blocks can be allocated to the OS partition as all user partition's logical groups will be sorted to cold state and folded to the MLC portion.

Support for Multiple Update Blocks per Stream

Writes from a steam may be stored into multiple blocks. Every time a first logical group is partially written in a first block and is followed by a write of a different, second logical group, the second logical group is written to a second block in the hope that subsequent writes will furnish the incomplete data to complete the first logical group. This will reduce fragmentation. Up to a predetermined number of update blocks can be opened contemporaneously for this purpose. Beyond that, the incomplete logical group is made complete by padding the incomplete data.

Figure 19:
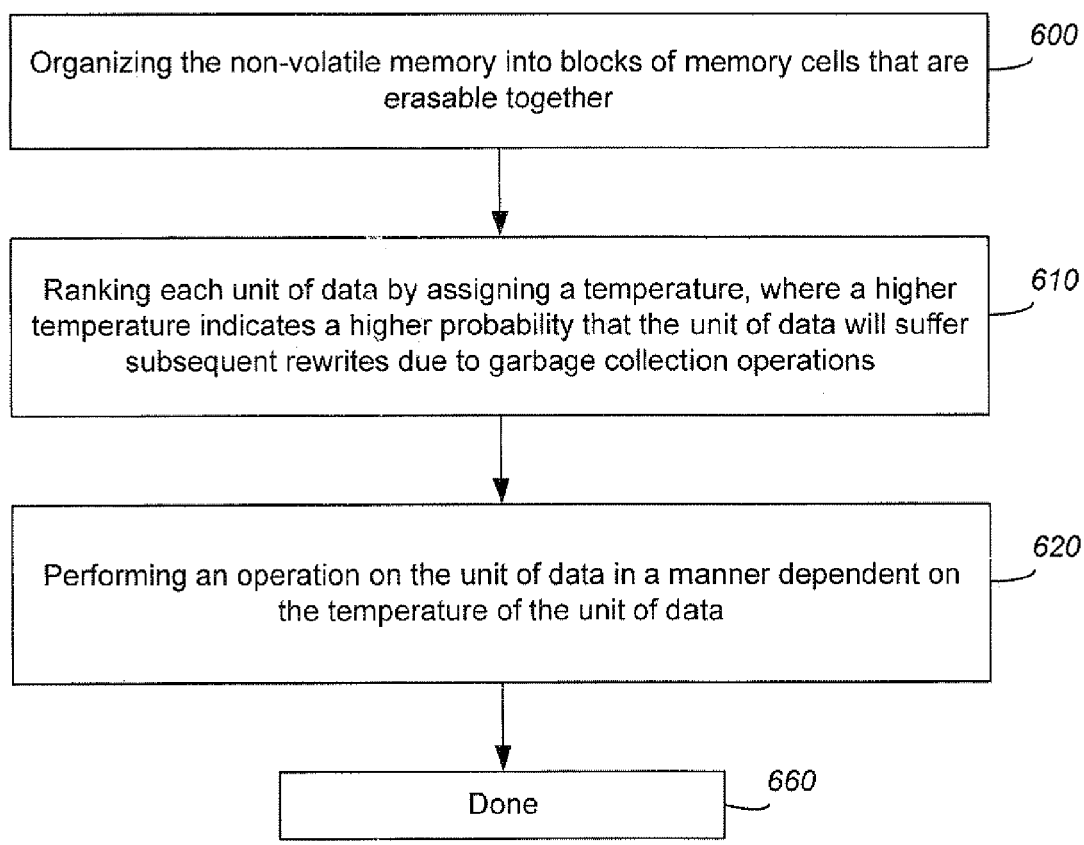
FIG. 19 is a flow diagram illustrating the scheme of temperature sorting for memory storage and operations.

FIG. 19 is a flow diagram illustrating the scheme of temperature sorting for memory storage and operations.
STEP 600: Organizing the non-volatile memory into blocks of memory cells that are erasable together.
STEP 610: Ranking each unit of data by assigning a temperature, where a higher temperature indicates a higher probability that the unit of data will suffer subsequent rewrites due to garbage collection operations.
STEP 620: Performing an operation on the unit of data in a manner dependent on the temperature of the unit of data.
STEP 630: Done.

Figure 20:
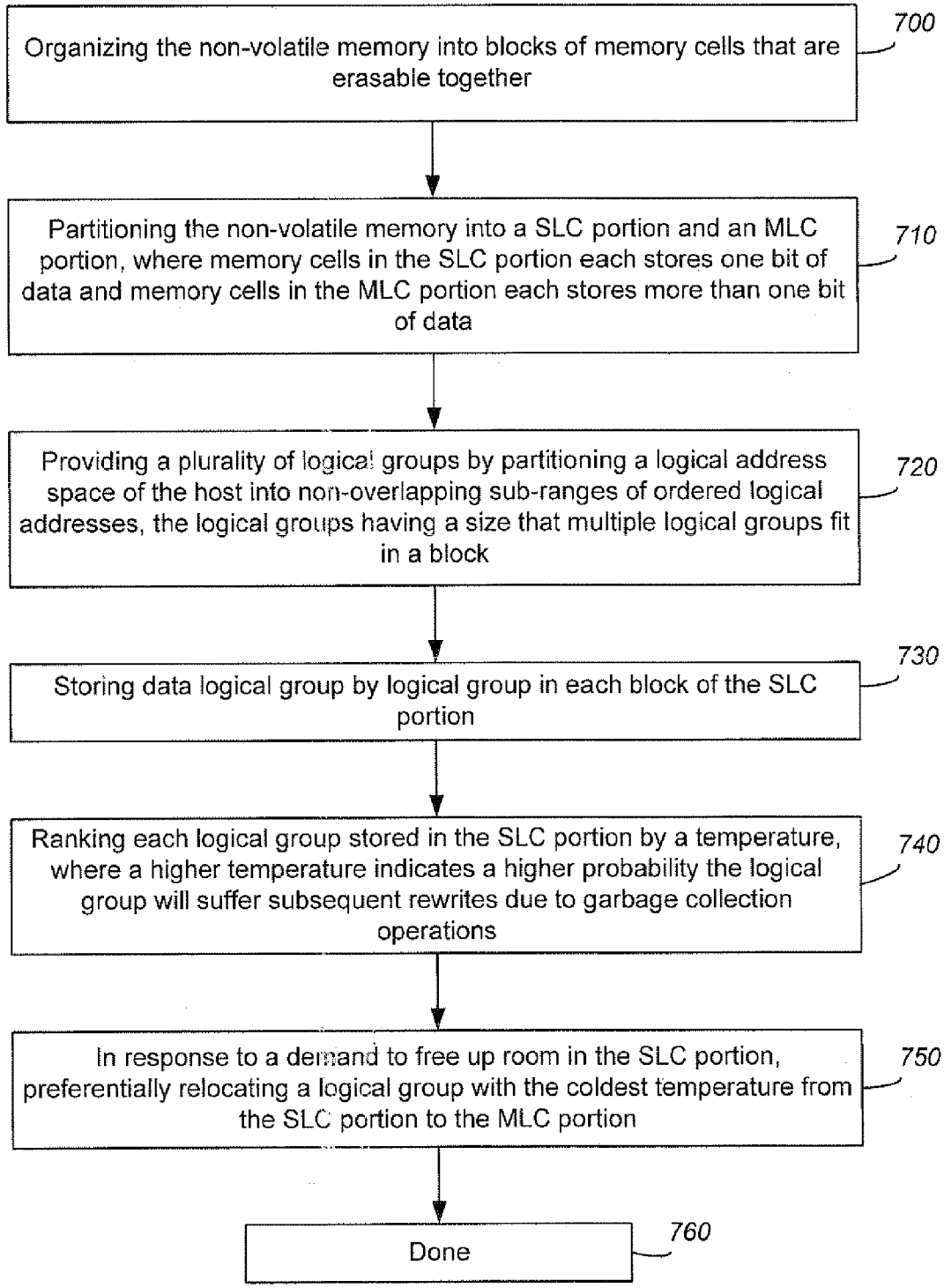
FIG. 20 is a flow diagram illustrating the scheme of temperature sorting at the logical group level.

FIG. 20 is a flow diagram illustrating the scheme of temperature sorting at the logical group level.
STEP 700: Organizing the non-volatile memory into blocks of memory cells that are erasable together.
STEP 710: Partitioning the non-volatile memory into a SLC portion and an MLC portion, where memory cells in the SLC portion each stores one bit of data and memory cells in the MLC portion each stores more than one bit of data.
STEP 720: Providing a plurality of logical groups by partitioning a logical address space of the host into non-overlapping sub-ranges of ordered logical addresses, the logical groups having a size that multiple logical groups fit in a block.
STEP 730: Storing data logical group by logical group in each block of the SLC portion.
STEP 740: Ranking each logical group stored in the SLC portion by a temperature, where a higher temperature indicates a higher probability the logical group will suffer subsequent rewrites due to garbage collection operations.
STEP 750: In response to a demand to free up room in the SLC portion, preferentially relocating a logical group with the coldest temperature from the SLC portion to the MLC portion.
STEP 760: Done.

Figure 21:
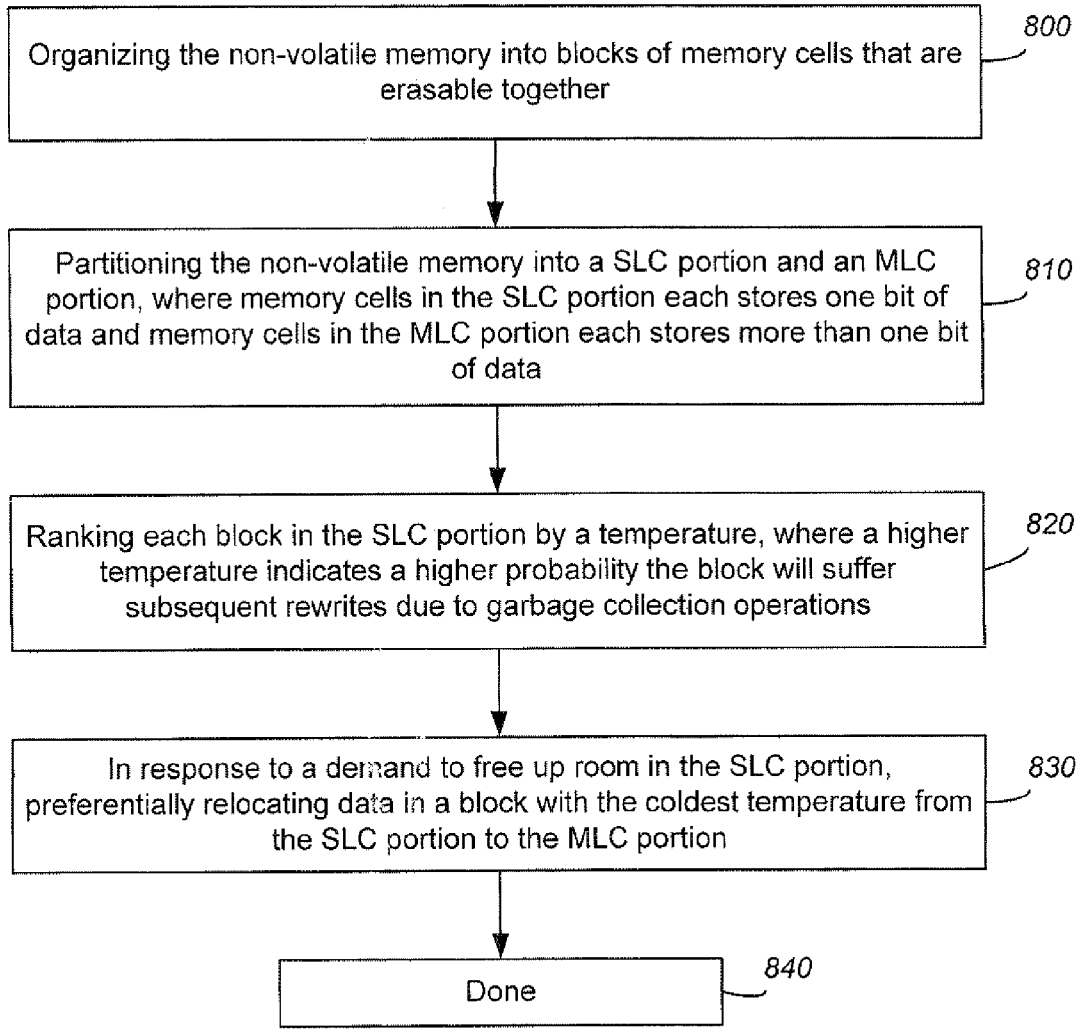
FIG. 21 is a flow diagram illustrating the scheme of temperature sorting at the block level.

FIG. 21 is a flow diagram illustrating the scheme of temperature sorting at the block level.
STEP 800: Organizing the non-volatile memory into blocks of memory cells that are erasable together.
STEP 810: Partitioning the non-volatile memory into a SLC portion and an MLC portion, where memory cells in the SLC portion each stores one bit of data and memory cells in the MLC portion each stores more than one bit of data.
STEP 820: Ranking each block in the SLC portion by a temperature, where a higher temperature indicates a higher probability the block will suffer subsequent rewrites due to garbage collection operations.
STEP 830: In response to a demand to free up room in the SLC portion, preferentially relocating data in a block with the coldest temperature from the SLC portion to the MLC portion.
STEP 840: Done.

Although the various aspects of the present invention have been described with respect to certain embodiments, it is understood that the invention is entitled to protection within the full scope of the appended claims.

It is claimed:
1. A method of operating on units of data in a non-volatile memory, comprising:
   organizing the non-volatile memory into blocks of memory cells that are erasable together;
   partitioning the non-volatile memory into a SLC portion and an MLC portion, where memory cells in the SLC portion each stores one bit of data and memory cells in the MLC portion each stores more than one bit of data;
   providing a plurality of logical groups by partitioning a logical address space of the host into non-overlapping sub-ranges of ordered logical addresses, wherein multiple logical groups are storable in each block and each logical group having a plurality of corresponding logical pages;
   providing first and second operational layers in the SLC portion and a third operational layer in the MLC portion;
   initially storing host data being written in the first operational layer and subsequently relocating the host data therefrom logical-group by logical-group into either the second or third operational layer;
   ranking each logical group by assigning a temperature, the temperature being determined as a function of a time stamp value and potential for future rewrites of each logical group, the time stamp providing a relative measure of how recently written in is each of the logical group, and where a higher temperature indicates a higher probability that the logical group will suffer subsequent rewrites due to garbage collection operations; and
   evicting a logical group from the second operational layer to the third operational layer in a manner dependent on the temperature associated with the logical group being evicted.

2. The method as in claim 1, further comprising
   providing a predetermined dynamic range of temperature between a lowest temperature and a highest temperature; and
   biasing the temperature in said ranking such that any temperate ranked colder than the lowest temperature is assigned the lowest temperature and any temperature ranked hotter than the highest temperature saturates at the highest temperature.

3. The method as in claim 1, further comprising:
   wherein said evicting is in response to a demand to free up room in the SLC portion to preferentially relocating a logical group with the coldest temperature from the second layer of the SLC portion to the third layer of the MLC portion.

4. The method as in claim 1, wherein the temperature associated with a logical group is stored within the logical group.

5. The method as in claim 1, wherein the temperature associated with a logical group is stored in a table in the non-volatile memory.

6. The method as in claim 1, wherein a logical group is ranked a lower temperature when the logical group is less recently written by a host.

7. The method as in claim 1, wherein a logical group is ranked a lower temperature when the logical group is less recently read.

8. The method as in claim 1, wherein a first logical group is ranked a lower temperature than a second logical group when the first logical group is part of a first host write and the first host write is longer than a second host write containing the second logical group.

9. The method as in claim 1, wherein a logical group is ranked to have a lower temperature when the logical group has suffered less number of compaction operations.

10. The method as in claim 1, wherein the logical groups having a size that multiple logical groups fit in a block.

11. The method as in claim 1, wherein:
each unit of data is a block.

12. The method as in claim 11, wherein a block is ranked a lower temperature when the block is less recently written by a host.

13. The method as in claim 1, further including
performing an operation is to store the unit of data with other units of data having similar temperatures within a predetermined range of temperatures.

14. The method as in claim 13, wherein:
the unit of data and the other units of data having similar temperatures are stored in a same block.

15. The method as in claim 14, wherein:
the unit of data is from a host write.

16. The method as in claim 14, wherein:
the unit of data is from a relocation operation.

17. A non-volatile memory for storing units of data, comprising:
a memory array organized into blocks of memory cells that are erasable together;
said memory array being partitioned the non-volatile memory into a SLC portion and an MLC portion, where memory cells in the SLC portion each stores one bit of data and memory cells in the MLC portion each stores more than one bit of data and for storing data logical group by logical group in each block of the SLC portion;
first and second operational layers in the SLC portion and a third operational layer in the MLC portion;
a plurality of logical groups provided by partitioning a logical address space of the host into non-overlapping groups of sequential logical addresses, wherein multiple logical groups are storable in each block and each logical group having a plurality of corresponding logical pages;
the first operational layer for initially storing host data being written and for subsequently relocating therefrom the host data logical-group by logical-group into the second or third layers; and
a state machine controlling operations that include:
ranking each logical group by assigning a temperature, the temperature being determined as a function of a time stamp value and potential for future rewrites of each logical group, the time stamp providing a relative measure of how recently written in is each of the logical group, and where a higher temperature indicates a higher probability that the logical group will suffer subsequent rewrites due to garbage collection operations; and
evicting a logical group from the second operational layer to the third operational layer in a manner dependent on the temperature associated with the logical group being evicted.

18. The non-volatile memory as in claim 17, wherein the operations controlled by the state machine further comprises:
providing a predetermined dynamic range of temperature between a lowest temperature and a highest temperature; and
biasing the temperature in said ranking such that any temperate ranked colder than the lowest temperature is assigned the lowest temperature and any temperature ranked hotter than the highest temperature saturates at the highest temperature.

19. The non-volatile memory as in claim 17, wherein:
said evicting is in response to a demand to free up room in the SLC portion to preferentially relocating a logical group with the coldest temperature from the second layer of the SLC portion to the third layer of the MLC portion.

20. The non-volatile memory as in claim 17, wherein the temperature associated with a logical group is stored within the logical group.

21. The non-volatile memory as in claim 17, wherein the temperature associated with a logical group is stored in a table in the non-volatile memory.

22. The non-volatile memory as in claim 17, wherein a logical group is ranked a lower temperature when the logical group is less recently written by a host.

23. The non-volatile memory as in claim 17, wherein a logical group is ranked a lower temperature when the logical group is less recently read.

24. The non-volatile memory as in claim 17, wherein a first logical group is ranked a lower temperature than a second logical group when the first logical group is part of a first host write and the first host write is longer than a second host write containing the second logical group.

25. The non-volatile memory as in claim 17, wherein a logical group is ranked to have a lower temperature when the logical group has suffered less number of compaction operations.

26. The non-volatile memory as in claim 17, wherein the logical groups having a size that multiple logical groups fit in a block.

27. The non-volatile memory as in claim 17, wherein:
each unit of data is a block.

28. The non-volatile memory as in claim 27, wherein a block is ranked a lower temperature when the block is less recently written by a host.

29. The non-volatile memory as in claim 17, wherein:
said performing an operation is to store the unit of data with other units of data having similar temperatures within a predetermined range of temperatures.

30. The non-volatile memory as in claim 29, wherein:
the unit of data and the other units of data having similar temperatures are stored in a same block.

31. The non-volatile memory as in claim 30, wherein:
the unit of data is from a host write.

32. The non-volatile memory as in claim 30, wherein:
the unit of data is from a relocation operation.

* * * * *